United States Patent [19]
Miller

[11] Patent Number: 6,164,514
[45] Date of Patent: Dec. 26, 2000

[54] MICRO-MANIPULATOR FOR ULTRASONIC BONDING WITH ORTHOGONAL TOOL SUPPORT SLIDES

[76] Inventor: Charles F. Miller, 651 Pathfinder Trail, Anaheim Hills, Calif. 92665

[21] Appl. No.: 09/153,206

[22] Filed: Sep. 15, 1998

[51] Int. Cl.[7] .............................. B23K 1/06; B23K 5/20; B23K 37/00

[52] U.S. Cl. ............................................. 228/1.1; 228/4.5

[58] Field of Search ...................................... 228/1.1, 4.5

[56] References Cited

U.S. PATENT DOCUMENTS

| | | | |
|---|---|---|---|
| 3,474,685 | 10/1969 | Miller | 74/491 |
| 3,489,027 | 1/1970 | Christy | 228/4.5 |
| 3,626,590 | 12/1971 | Miller | 228/4.5 |
| 3,773,240 | 11/1973 | Helm | 228/4.5 |
| 4,475,681 | 10/1984 | Ingle | 228/4.5 |
| 5,871,136 | 2/1999 | Miller | 228/4.5 |

*Primary Examiner*—Patrick Ryan
*Assistant Examiner*—Zidia T. Pittman
*Attorney, Agent, or Firm*—William L. Chapin

[57] ABSTRACT

A micro-manipulator apparatus for precisely positioning the tip of an ultrasonic bonding tool or similar implement relative to a work piece includes a pantograph-like input manipulator mechanism coupled by a downward depending ball joint coupling to the rear end portion of a tool support plate comprising part of a follower mechanism. The follower mechanism comprises a vertically cascaded series of members linearly rollable in orthogonal directions with respect to a work piece by means of three pairs of linear roller bearings, consisting of an upper, primary bearing slide structure mounted to a lateral side wall of a vertically disposed support plate by a vertically disposed pair of longitudinally opposed linear bearings permitting vertical, Z-axis motion relative to the support plate, a secondary bearing slide structure mounted to the lower side of a flange member which protrudes laterally outwardly from the primary slide structure by a pair of laterally disposed longitudinally opposed linear bearings permitting lateral, x-axis motion, and a pair of longitudinally disposed, laterally opposed linear bearings which depend downwardly from the lower side of the secondary bearing slide structure permitting longitudinal, y-axis motion of the tool support plate and a tool which may depend downwardly from the front portion of the tool support plate. With this arrangement, the lowest surface of the apparatus may be the tool tip, providing a work space of potentially unlimited lateral extent beneath the apparatus and thereby allowing the work piece to be located on a conveyor belt below the apparatus.

41 Claims, 29 Drawing Sheets

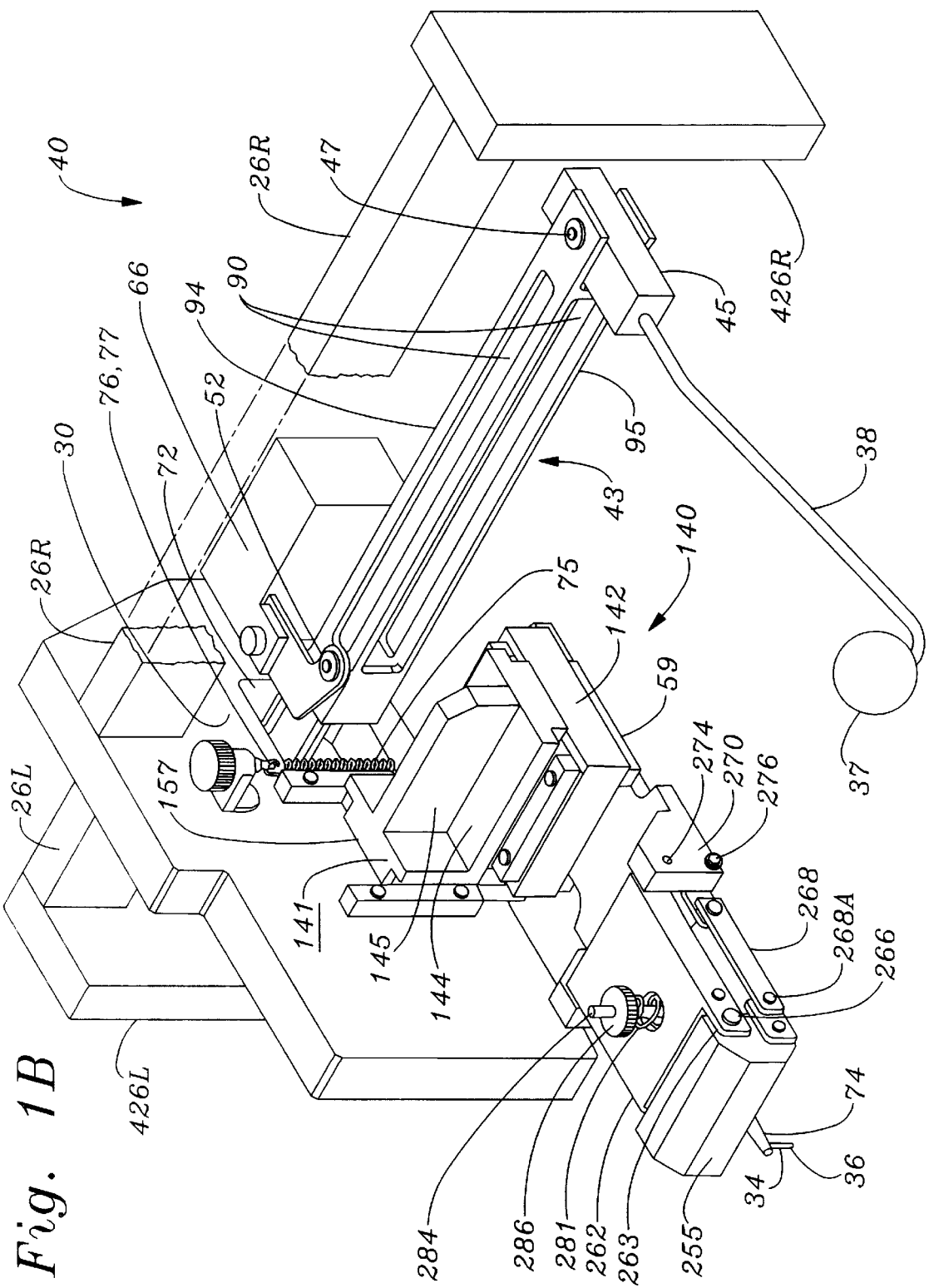

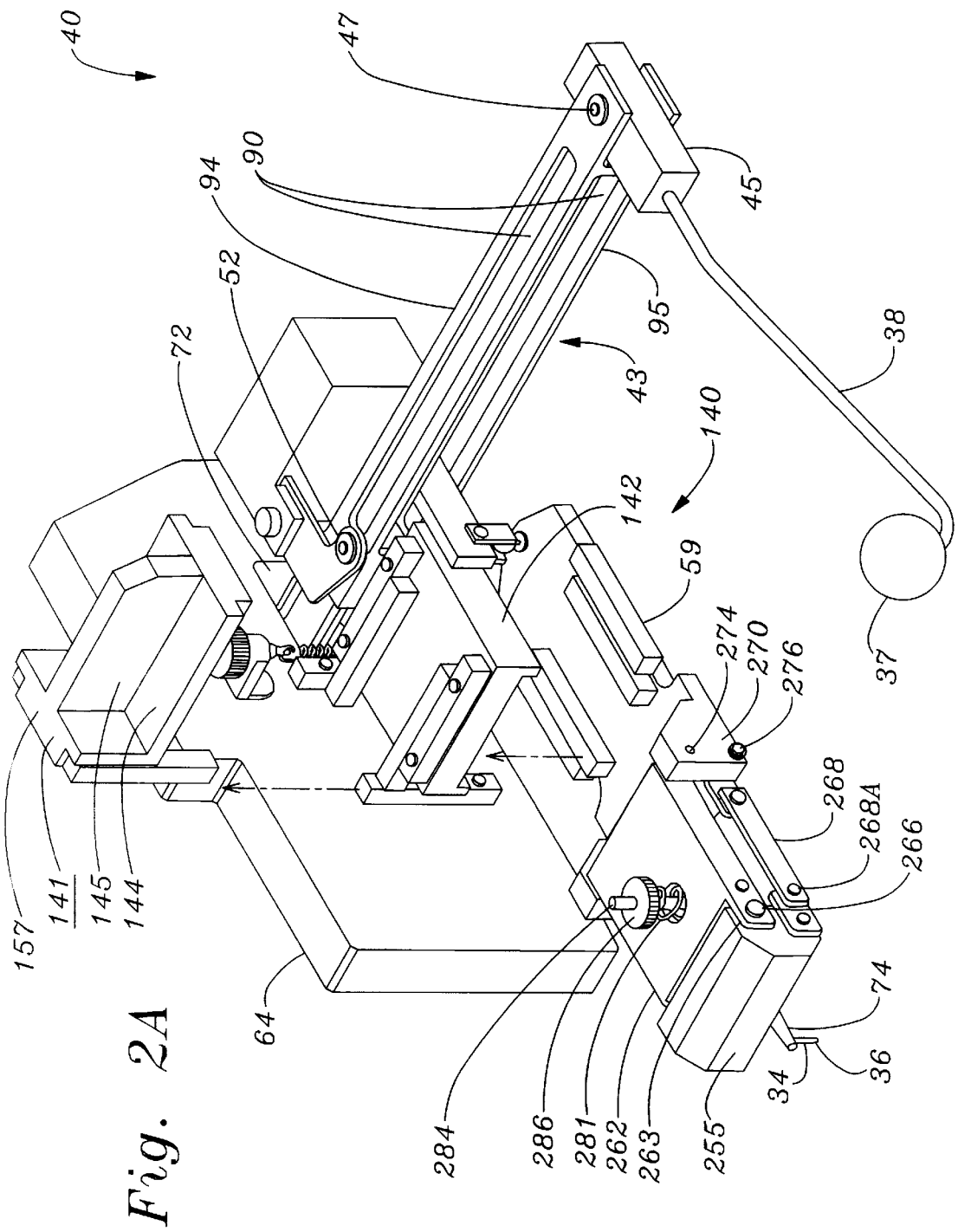

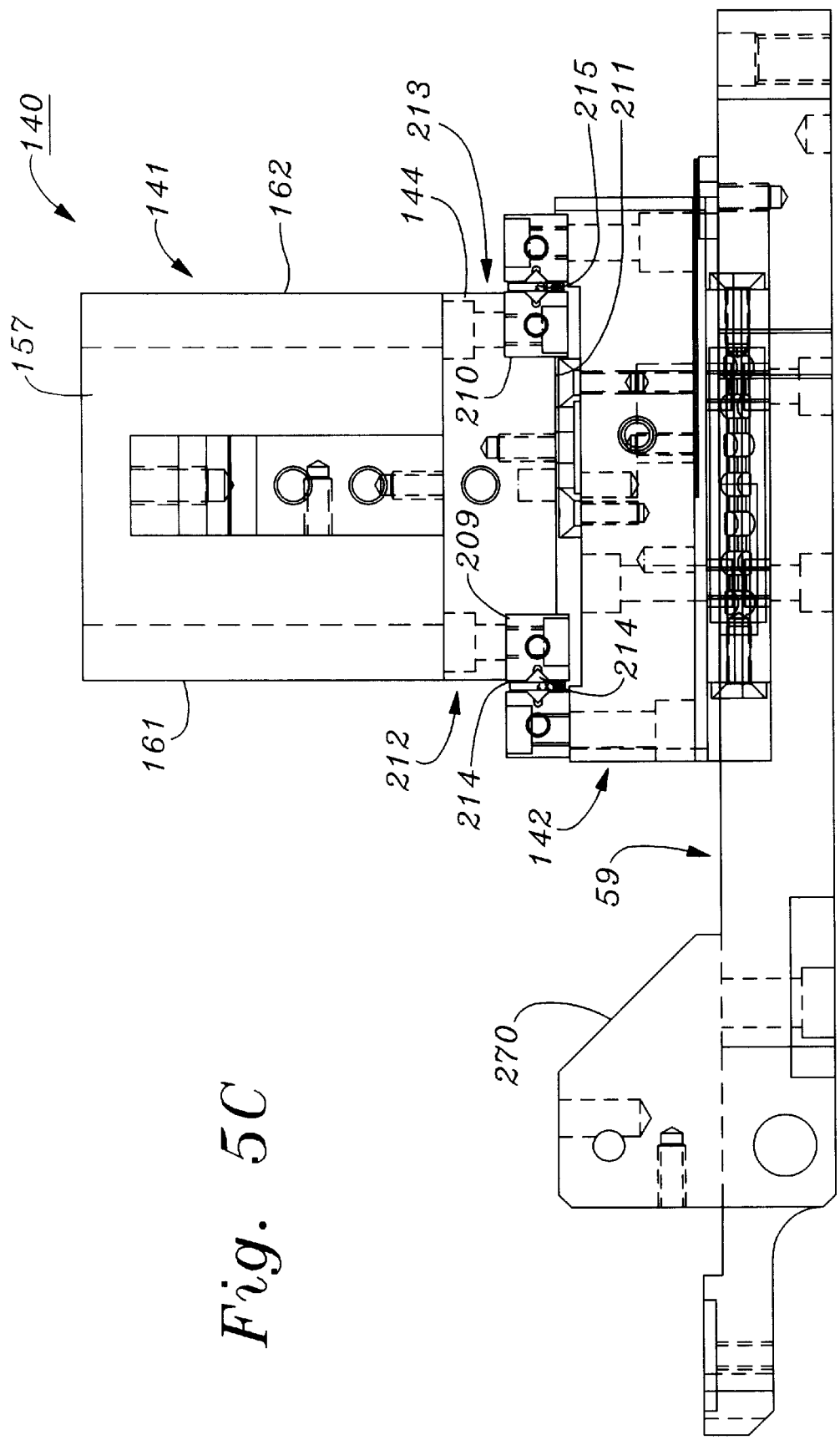

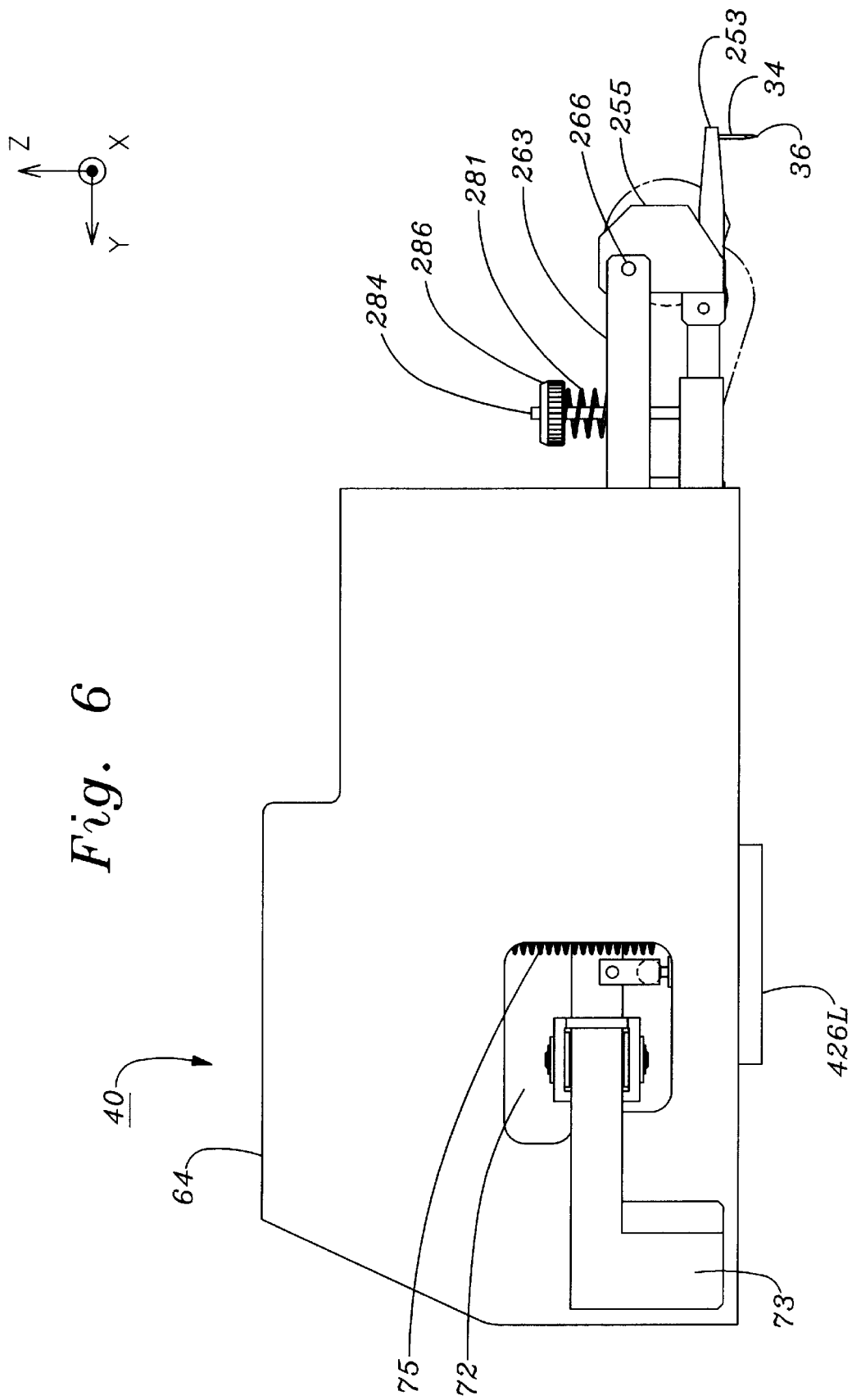

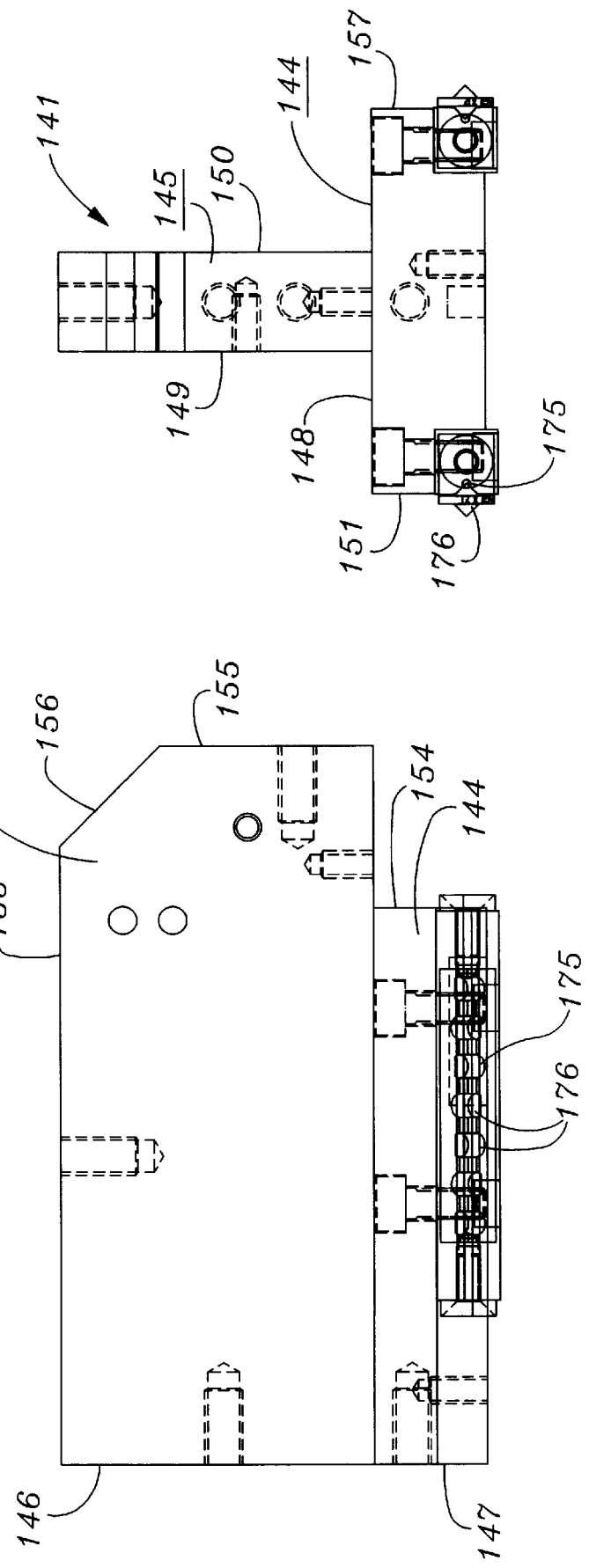

MICRO-MANIPULATOR FOR ULTRASONIC BONDING WITH ORTHOGONAL TOOL SUPPORT SLIDES

BACKGROUND OF THE INVENTION

A. Field of the Invention

The present invention relates to an apparatus for precisely positioning an ultrasonic bonding tool or similar implement relative to a workpiece. More particularly, the invention relates to a micro-manipulator apparatus which includes an input position controller mechanism coupled to an output follower mechanism effective in positioning the tip of an ultrasonic or similar wire bonding tool at precisely determinable locations relative to a microcircuit or similar workpiece, moving the tool tip into contact with the workpiece to form a bond, and withdrawing the tool tip upon completion of a bond.

B. Description of Background Art

A large variety of scientific procedures, medical procedures and industrial processes require the use of a type of apparatus referred to generally as a micro-manipulator for the precise positioning of a tip of a tool or instrument relative to a small workpiece or other such object. For example, the manufacture of electronic components such as integrated microcircuits requires the use of a micro-manipulator-type apparatus, for the following reasons.

Integrated circuits are fabricated from thin slices of a semi-conducting material such as silicon, germaniun, gallium arsenide, or other III–IV compounds, i.e., compounds of elements from columns three and four of the periodic table. The slices are cut into small squares or rectangles referred to as chips or dice, ranging in size from squares about 100 mil (0.100 inch) on a side to several hundred mils. Transistors, diodes, resistors and interconnecting circuit paths are formed on each chip or die by diffusing impurities into selected regions of the die to produce a desired electrical conductivity. Various conducting paths and insulated layers are then deposited on the chip.

After a semi-conductor chip or die has been fabricated as described above, it must be attached to a base or carrier. A lid is then sealed to the base to form a package or container which protects the delicate die from damage. Prior to attaching the lid to the carrier which supports the die, conductive pads provide input and output conductive paths to the die must be electrically interconnected to more robust leads or terminals which extend outward from the carrier. These interconnections are customarily made using fine aluminum or gold wires. The wires are ultrasonically or thermo-sonically welded to the pads and external leads by a bonding tool that applies ultrasonic energy, or a combination of heat and ultrasonic energy, to a bonding site. Since the connection pads of a microcircuit are extremely tiny and closely spaced, great precision is required in positioning the tip of a bonding tool relative to the microcircuit.

Responsive to the need for an apparatus capable of precisely positioning the tip of an ultrasonic transducer to form wire bonds on microcircuit chips, the present inventor invented a micro-positioner apparatus which employs a novel pantograph-type manipulator input mechanism. That apparatus, which was disclosed in the present inventor's U.S. Pat. No. 3,474,685 and issued on Oct. 28, 1969, has proven to be highly effective in performing its intended functions, and wire bonding machines employing the novel design concepts including the pantograph mechanism disclosed in that patent are widely used throughout the electronics industry. However, the present inventor found that certain aspects of the micro-positioner disclosed in the 3,474,685 patent might be improved upon. For example, the allowable working or throat depth of the ultrasonic tool tip would preferably be larger for certain bonding applications.

Also, the use of offset pivotable mountings for the transducer tool support plate would desirably be minimized, thereby minimizing the requirement for springs to counter balance unbalanced forces exerted in supporting the tool support plate by offset mountings. Moreover, it would be desirable to have a micro-positioner apparatus in which various ultrasonic transducers and other bonding tool accessories such as wire spooling mechanisms, some of which might be substantially heavier than conveniently supportable by prior art micro-positioners, could be used. Such a need arises, for example, in bonding the heavier wires required for connection to certain electronic components such as wound coils and disk drive components. In response to those considerations, the present inventor disclosed a Micro-positioner For Ultrasonic Bonding, U.S. patent application Ser. No. 08/773,637 filed Dec. 24, 1996, now U.S. Pat. No. 5,871,136.

In that patent application the present inventor disclosed a micro-positioner apparatus having a pantograph-like input manipulator mechanism, and a follower mechanism coupled to the input manipulator mechanism by a ball joint and supporting an ultrasonic transducer housing and bonding tool on a tool support plate. The tool support plate is longitudinal slidably mounted on a tool support guide plate, allowing fore and aft motion of the tool tip. The tool support guide plate is in turn pivotably supported by a yoke having a yaw pivot bearing which allows lateral motion of the tool tip. The yoke is in turn supported by a pitch pivot bearing having a horizontally disposed pivot axis, thereby permitting pivotal motion in a vertical plane of the yoke, tool support plate, and tool tip. By a suitable choice of spacings between the pivot axes of the pantograph input manipulator mechanism, support bearings and ball joint, the tip of the bonding tool is caused to move in coordinate directions of a second coordinate system containing the tool tip in precisely scaled ratios of corresponding motions in a first coordinate system of an input control knob on the input manipulator mechanism. The combination of a longitudinally slidable tool support plate with two pivot bearings orthogonal to each other and to the slide axis, provides a micropositioner apparatus which has both a rugged construction capable of supporting heavy loads on the tool support plate, and a substantial throat depth. In a preferred embodiment of the disclosed apparatus, the longitudinal slide axis of the tool tip, and the pivot axes of the pitch and yaw pivot bearings all intersect at a common point, thereby assuring completely orthogonal motions of the tool tip in three orthogonal coordinate directions that are precisely scaled fractions of corresponding input control knob motions.

The present invention was conceived of to provide a micro-manipulator for ultrasonic bonding applications having a manipulator input mechanism and tool holder follower mechanism which are both pendent from an overlying support structure, thereby affording a work space of potentially unlimited lateral extent below the apparatus. Among other advantages, the large work space can accommodate workpieces located on a conveyor belt disposed below the apparatus.

OBJECTS OF THE INVENTION

An object of the present invention is to provide a micro-manipulator apparatus suitable for precisely positioning an ultrasonic bonding tool or similar implement relative to a workpiece, the apparatus having an input manipulator mechanism coupled to a follower mechanism for supporting a tool, in which motions of the input mechanism in a first, manipulator coordinate system causing precisely corresponding motions to be effected by the follower mechanism and tool tip in a second, tool coordinate system, the input and follower mechanisms of the apparatus being located above a work plane, thereby providing an unobstructed work space.

Another object of the invention is to provide a micro-manipulator apparatus for ultrasonic bonding in which all of the components thereof may be located above a work plane.

Another object of the invention is to provide a micro-manipulator apparatus having an input manipulator mechanism for receiving input tool position commands in at least two coordinate directions in a first coordinate system, and, coupled to the input manipulator mechanism, an output follower mechanism in which a tool tip is moved in a second coordinate system related to the first coordinate system along a plurality of linear motion slide support means, one for each coordinate direction in the second coordinate system.

Another object of the invention is to provide a micro-manipulator apparatus for ultrasonic bonding which has an input manipulator mechanism having an input control member movable in three coordinate directions in an input coordinate system corresponding to input position commands, and, coupled to the input manipulator mechanism, an output follower mechanism having a first slide support member slidably mounted with respect to a support structure in a first output coordinate direction corresponding to a first coordinate direction of the input coordinate system, a second slide support member slidably mounted with respect to said first slide support member slidably mounted with respect to said first slide support member in a second output coordinate direction corresponding to a second coordinate direction of the input coordinate system, and a third, tool support slide member slidably mounted with respect to said second slide support member, slidably mounted with respect to said second slide support member in a third coordinate direction corresponding to a third output coordinate direction of the input coordinate system.

Another object of the invention is to provide a micro-manipulator apparatus which includes an output tool support member slidably mounted to a support structure by means of three cascaded slide supports movable along three orthogonal directions relative to the support structure.

Another object of the invention is to provide a micro-manipulator apparatus which includes an input manipulator mechanism and an output follower mechanism having a tool support member slidably mounted to a support structure by means of three cascaded, mutually orthogonal slidable support mounts along three orthogonal directions relative to the support structure, and a bonding tool mounted to the tool support member by means of a four-bar linkage, the latter permitting resilient upward movement of the tool tip in response to downward pressure of the tool tip on a workpiece, but solely in a vertical direction.

Another object of the invention is to provide a micro-manipulator apparatus for moving the tip of an ultrasonic bonding tool to a position overlying a bonding site, moving the tip into contact with the site to form a bond, braking the tip to inhibit inadvertent motion of the tip in at least one direction during formation of the bond, unbraking the tip after formation of the bond, and withdrawing the tip thereafter, the bonding tool being attached to an output tool support follower mechanism mounted to a support structure by means of three cascaded, mutually orthogonally slidable supports comprising three mutually orthogonal linear bearing assemblies.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends a micro-manipulator apparatus for dynamically positioning an implement relative to a workpiece, particularly an ultrasonic bonding tool tip relative to a miniature electronic component, moving the tool tip into contact with a selected bonding site to permit formation of a bond by application of ultrasonic energy to the bonding site, and withdrawing the tip upon completion of the bond. A preferred embodiment of a micro-manipulator apparatus according to the present invention includes a preferably manually operable manipulator input mechanism coupled by means of a ball joint to a follower mechanism which includes a tool support structure for holding an ultrasonic bonding tool or similar implement. Position commands input to the manipulator input mechanism, as for example, by human manipulation of a control knob comprising an input element of the mechanism, are coupled to the follower mechanism, resulting in motions of the tool tip that are precisely scaled fractions of the input position commands. According to the invention, motions of an input member of the manipulator mechanism in an input coordinate system effect precisely ratioed motions of a tool tip in an output follower coordinate system. The apparatus according to the present invention may have as few as one degree of freedom for both the input and output follower coordinate systems. Preferably, however, the input manipulator has three degrees of translational freedom along three orthogonal coordinate axes of an input coordinate system, resulting in translational motions of a tool tip along three orthogonal axes of the output follower coordinate system.

According to one aspect of the invention, the follower mechanism is mounted to a support structure by means of at least two mutually orthogonally disposed linear bearing sets, one for each degree of tool-tip freedom. In a preferred embodiment of the invention, a primary bearing slide structure is linearly movably fastened to a support structure by means of first linear bearing means, a secondary or intermediate bearing slide structure is linearly movably fastened to the primary bearing slide structure by second linear bearing means having a line of action orthogonal to that of the first linear bearing means, and a tertiary bearing slide structure is linearly movably fastened to the secondary slide support structure by third linear bearing means having a line of action orthogonal to those of both the first and second bearing means. A tool such as an ultrasonic bonding tool is fastened to the third bearing slide structure, which thus comprises a tool support member.

In a preferred embodiment of the invention, three bearing support slide structures forming a cascaded series are used, with the primary bearing slide structure being vertically movably fastened to a support structure wall by a pair of parallel, longitudinally opposed, vertically disposed linear roller bearings. The secondary or intermediate bearing support slide structure is laterally movably fastened to the underside of a laterally outwardly protruding, horizontally disposed leg of the primary bearing slide structure by a pair of parallel, longitudinally opposed, laterally disposed roller bearings. The tertiary, tool-support bearing support slide structure is longitudinally slidably fastened to the underside of the intermediate slide support by a pair of parallel, laterally opposed, longitudinally disposed linear roller bearings.

In the preferred embodiment, the tool support slide is horizontally disposed, movable in a fore and aft, longitudinal direction and supports near the front longitudinal end thereof an ultrasonic force transducer having a downwardly depending tool tip for contacting a workpiece such as an electronic microcircuit.

According to the present invention, the manipulator input mechanism is located to the rear of and at a higher elevation than the follower mechanism, and is coupled to the follower mechanism by a ball joint. The ball joint includes a ball which protrudes upwardly from the rear longitudinal end of the tool support slide and a socket which protrudes downwardly from a manipulator input mechanism cross member. With this construction, the lowest component surface of the apparatus may be the bottom surface of the tool support slide. Since the tool support slide is coupled through overlying cascaded bearing support slide structures to a support structure located above the tool support slide, a work space of potentially unlimited lateral extent is provided beneath the apparatus.

Preferably, the ultrasonic transducer is resiliently fastened to the tool support slide, allowing the transducer and tool tip to move upwards when the tip is moved downwards into contact with a bonding site, thereby limiting the downward force exerted by the tip on the bonding site. Resilient upward displacement of the transducer may also be used to activate a switch which conducts a pulse of current of predetermined duration to the transducer. By including a four-bar linkage between the tool support plate and resilient transducer mounting resilient displacements of the tool tip are constrained to occur only in a vertical direction.

BRIEF DESCRIPTION OF THE DRAWINGS

FIG. 1B is a fragmentary view of the bonding machine of FIG. 1, showing certain components thereof removed to better reveal the micro-manipulator apparatus portion of the machine.

FIG. 2A is an exploded front perspective view of the micro-manipulator apparatus of FIG. 1.

FIGS. 5B, 5C and 5D are fragmentary right side elevation views of the apparatus of FIG. 2, on enlarged scales.

FIG. 6 is a left side elevation view of the apparatus of FIG. 2.

FIG. 7B is a fragmentary front elevation view of the apparatus of FIG. 2, showing linear bearing structures thereof.

FIG. 7C is a fragmentary side perspective view of the apparatus of FIG. 2, showing orthogonal linear bearing support structures thereof.

DESCRIPTION OF THE PREFERRED EMBODIMENTS

Figure 1A:
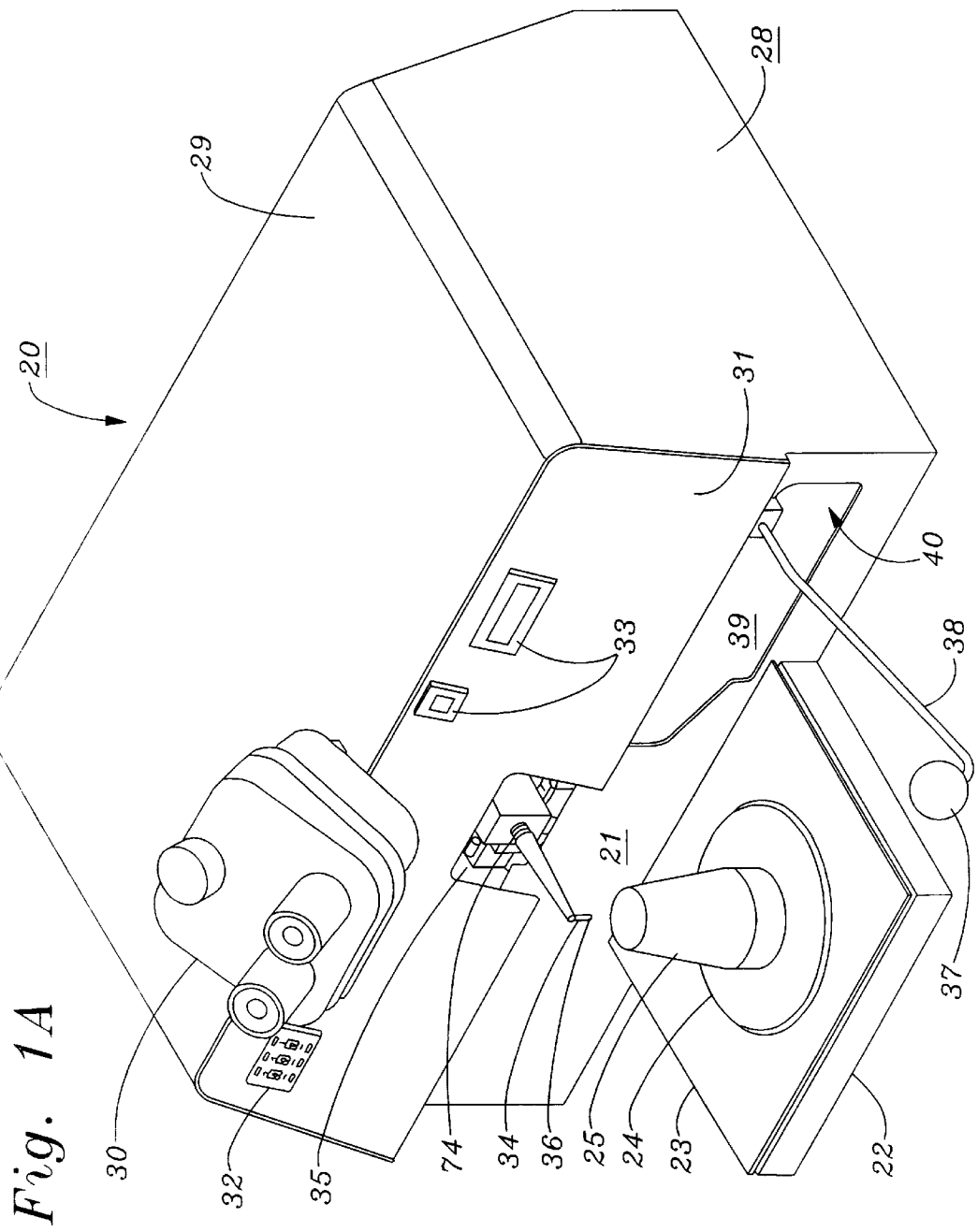
FIG. 1A is a right front upper perspective view of a micro-manipulator apparatus for ultrasonic bonding with orthogonal tool support slides according to the present invention, showing the apparatus mounted on a support base and showing other elements combined with the apparatus to comprise an ultrasonic bonding machine.

Referring now to FIGS. 1–13, a micro-manipulator apparatus with orthogonal tool support slides according to the present invention is shown. The embodiment of the apparatus illustrates in FIGS. 1–13 is intended to be used primarily for performing ultrasonic bonding on devices such as microcircuits. Accordingly, that embodiment of the invention is shown to be provided with an ultrasonic tool suitable for making ultrasonic bonds.

FIG. 1 shows a micro-manipulator apparatus 40 according to the present invention, operably interconnected with other elements to comprise a manually operable ultrasonic bonding machine 20. Bonding machine 20 may be used to make ultrasonic wire bonds on miniature electronic components such as monolithic or hybrid micro circuits. As shown in FIG. 1, bonding machine 20 includes a base plate 21 on which is mounted a micro-manipulator apparatus 40, which is described in detail below. A rectangularly shaped platform 22 protrudes forward from base plate 21 and supports a work table 23 that may include a turntable 24 for rotatably supporting an anvil 25, which in turn is used to support a microcircuit or other work piece.

Figure 3:
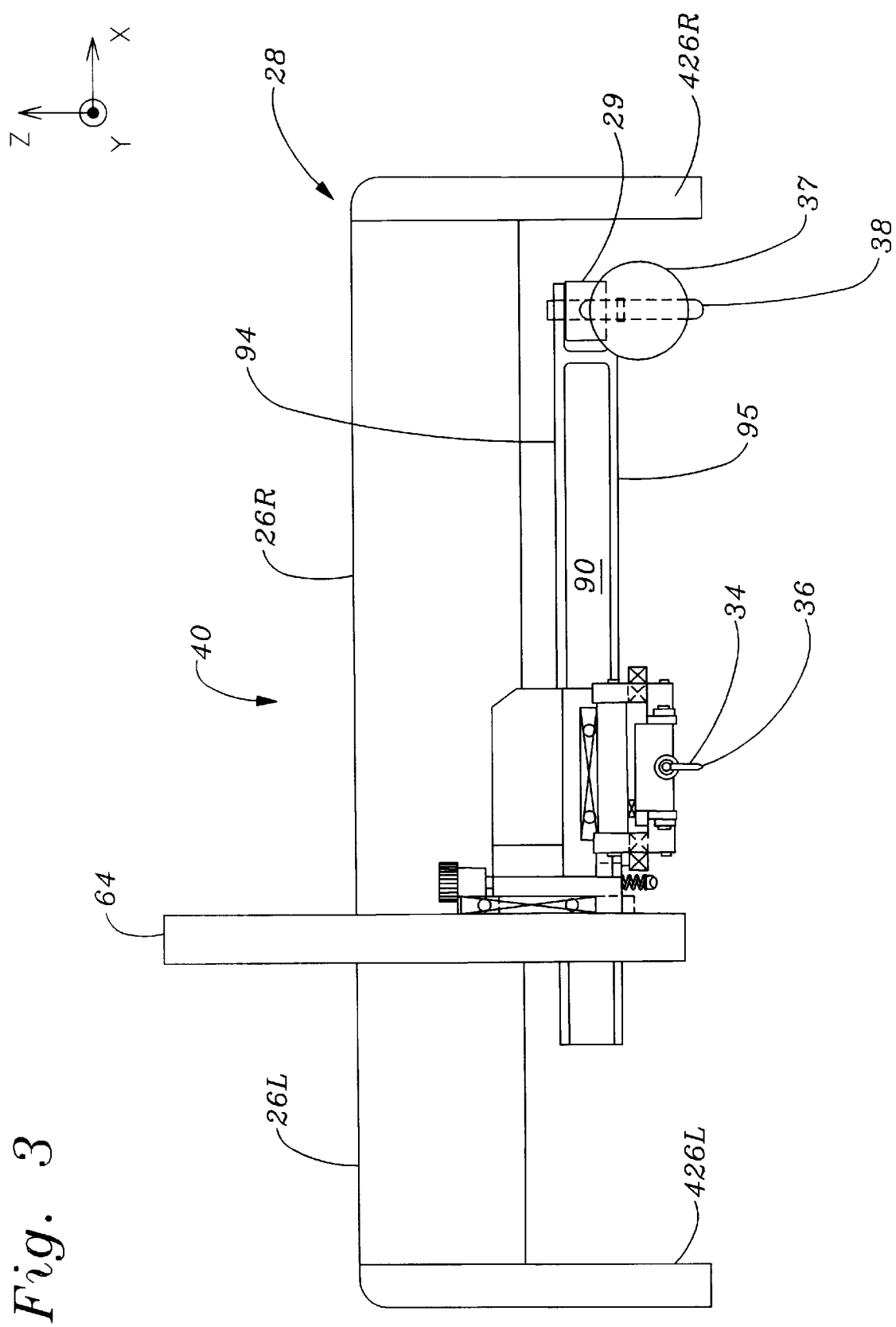
FIG. 3 is a front elevation view of the apparatus of FIG. 2.

As shown in FIG. 1, micro-manipulator apparatus 40 includes a vertically disposed support plate 64. Vertical support plate 64 is held at opposite lateral faces thereof between a short left and longer right horizontally disposed support beams 26L and 26R, respectively. Each support beam has at the outer lateral end thereof a downwardly depending support post 426L, 426R, respectively that may be supported by a pair of laterally spaced apart vertical pedestals 27, which protrude upwardly from a horizontally disposed base plate 26. However, all components of apparatus 40 are located above the lower mounting faces of support posts 426L and 426R, and above the plane of the tool tip. Thus, as shown in FIG. 3, apparatus 40 may be mounted to a work table or other such structure by means such as posts 426L, 426R which depend downwardly from the apparatus support structure and which are attached to beams 26L, 26R. With this arrangement, a work space of potentially unlimited lateral extent is defined beneath apparatus 40. Such a work space may be used to accommodate work pieces located on a conveyer belt disposed below the apparatus.

Referring again to FIG. 1, ultrasonic bonding machine 20 may be seen to include a housing 28 having an upper panel 29 on which is mounted a stereo microscope 30. Microscope 30 has a field of view which encompasses a microcircuit or other such work piece placed on the upper surface of anvil 25. Housing 28 includes a front panel 31 on which are mounted various controls 32 such as switches and indicating devices 33.

Ultrasonic bonding machine 20 includes an ultrasonic bonding tool 34 which includes a,transducer tip and impedance matching horn 74A which protrudes forward of front panel 31 of housing 28. An ultrasonic bonding tool 36 provided with a tapered tip or point 36A protrudes downwardly from the outer end of transducer horn 74A. As will be described in detail below, bonding tool 34 is mechanically coupled to micro-manipulator apparatus 40 located within housing 28. Micro-manipulator 40 according to the present invention provides means for precisely positioning tip 36A of ultrasonic bonding tool 36 relative to a work piece. Positioning of bonding tool tip 36A is accomplished by manually operating a control knob 37 attached to the outer end of a control arm 38 that protrudes forward of front panel 31 of housing 28.

Figure 2B:
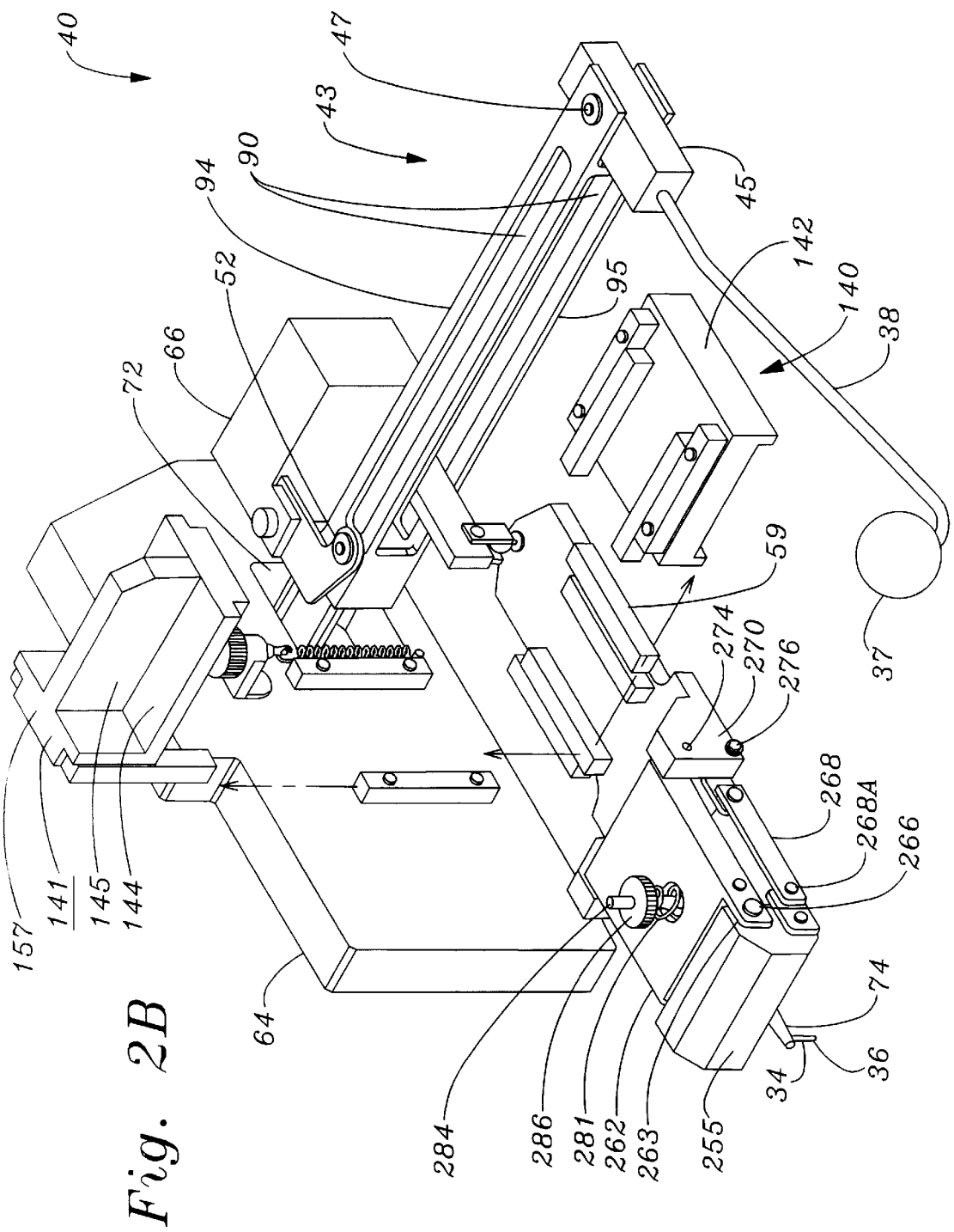
FIG. 2B is a view similar to that of FIG. 2A, but showing a different configuration of the apparatus.

Referring now to FIG. 1B, ultrasonic bonding machine 20 of FIG. 1A is shown with housing 28 removed, thereby revealing construction details of micro-manipulator apparatus 40 according to the present invention. In FIGS. 1A, 2 and the remaining figures, various electrical, electronic and mechanical components which operatively interact with micro-manipulator apparatus 40 have been deleted to facilitate an understanding of the novel and advantageous features of the micro-manipulator apparatus per se. The structure and function of the deleted items are clearly described in the present inventor's prior U.S. Pat. Nos. 3,474,685 and 5,163,728, and the description of those elements contained in the aforementioned patents are hereby incorporated by reference into the present specification.

The structure and function of novel micro-manipulator apparatus 40 according to the present invention may be more readily understood by first reviewing certain geometrical relationships between various elements of the apparatus.

Referring now to FIGS. 9, 10, 3 and 6, micro-manipulator apparatus 40 may be seen to include a manipulator input mechanism, designated generally by the element number 41, which functions as a pantograph-type, four-bar parallelogram linkage. Apparatus 40 also includes a novel follower mechanism 42 for movably supporting and precisely positioning an implement such as ultrasonic bonding tool 34, in response to command motions input to control knob 37 of manipulator mechanism 41.

Figure 9:
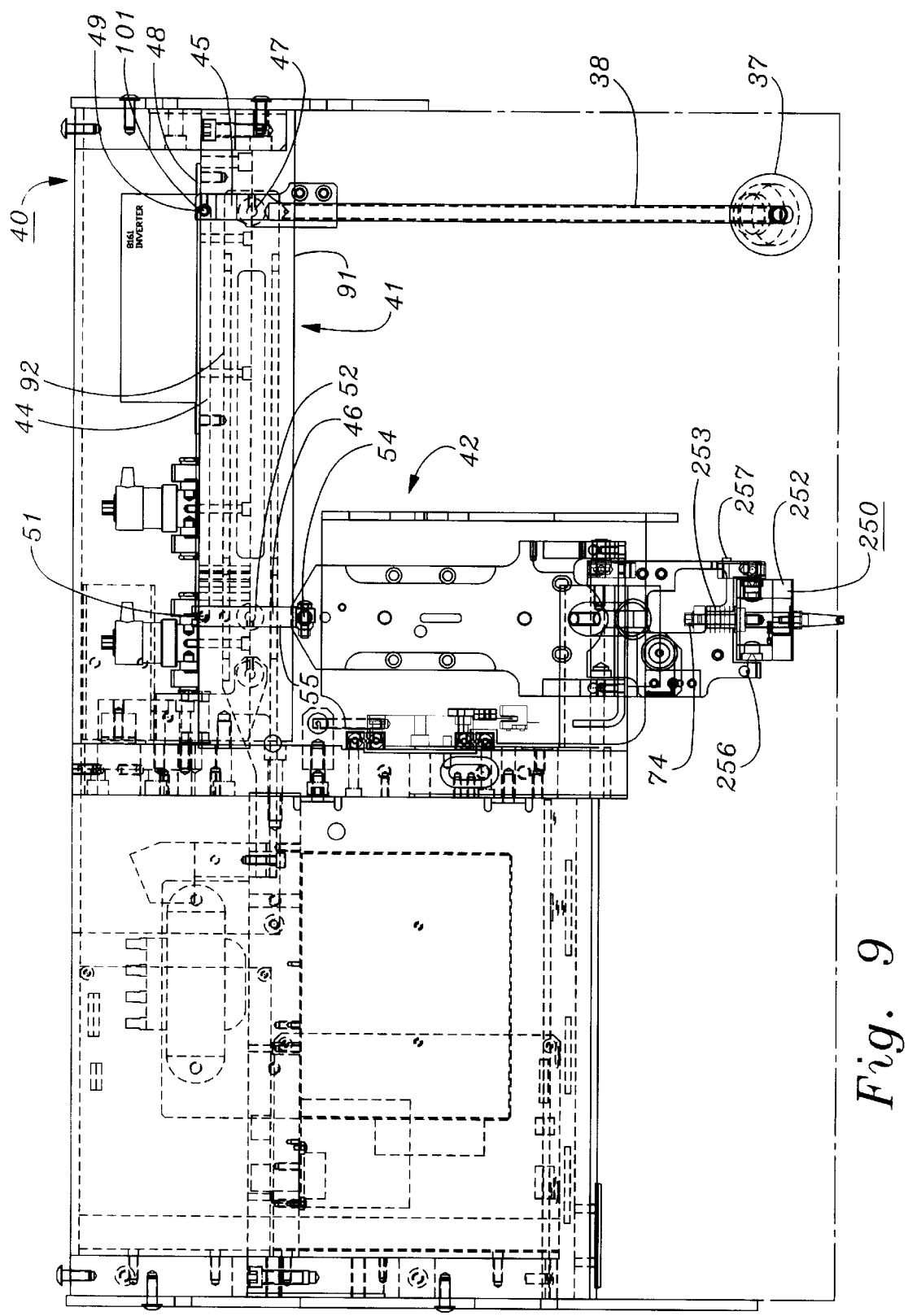
FIG. 9 is an upper plan view of the apparatus of FIG. 2.

As may be seen by referring to FIGS. 9, 10, 3 and 6, manipulator input mechanism 41 of micro-manipulator apparatus 40 includes a first, straight, generally laterally disposed front manipulator arm or beam 43 of relatively large cross-section, and a straight rear tie bar 44 of equal length but smaller cross section located rearwardly of the front arm. Manipulator beam 43 and tie bar 44 are pivotably joined to form a four-bar, parallelogram linkage, by short, straight longitudinally disposed outer and inner linkage bars 45 and 46, respectively. Thus, as shown in FIG. 9, a first, front outer pantograph pivot bearing 47 having a pivot axis disposed perpendicularly to front manipulator beam 43 joins the front manipulator beam to short, longitudinally disposed outer linkage bar 45. The inner or rear longitudinal end 48 of outer linkage bar 45 is joined to rear tie bar 44 by a second, rear outer pantograph pivot bearing 49 which has a pivot axis parallel to that of first pivot bearing 47. Outer linkage bar 45 has a portion that protrudes forward from first pivot bearing 47, beyond manipulator beam 43, where it is attached to the inner longitudinal end of manipulator input control arm 38.

Figure 4A:
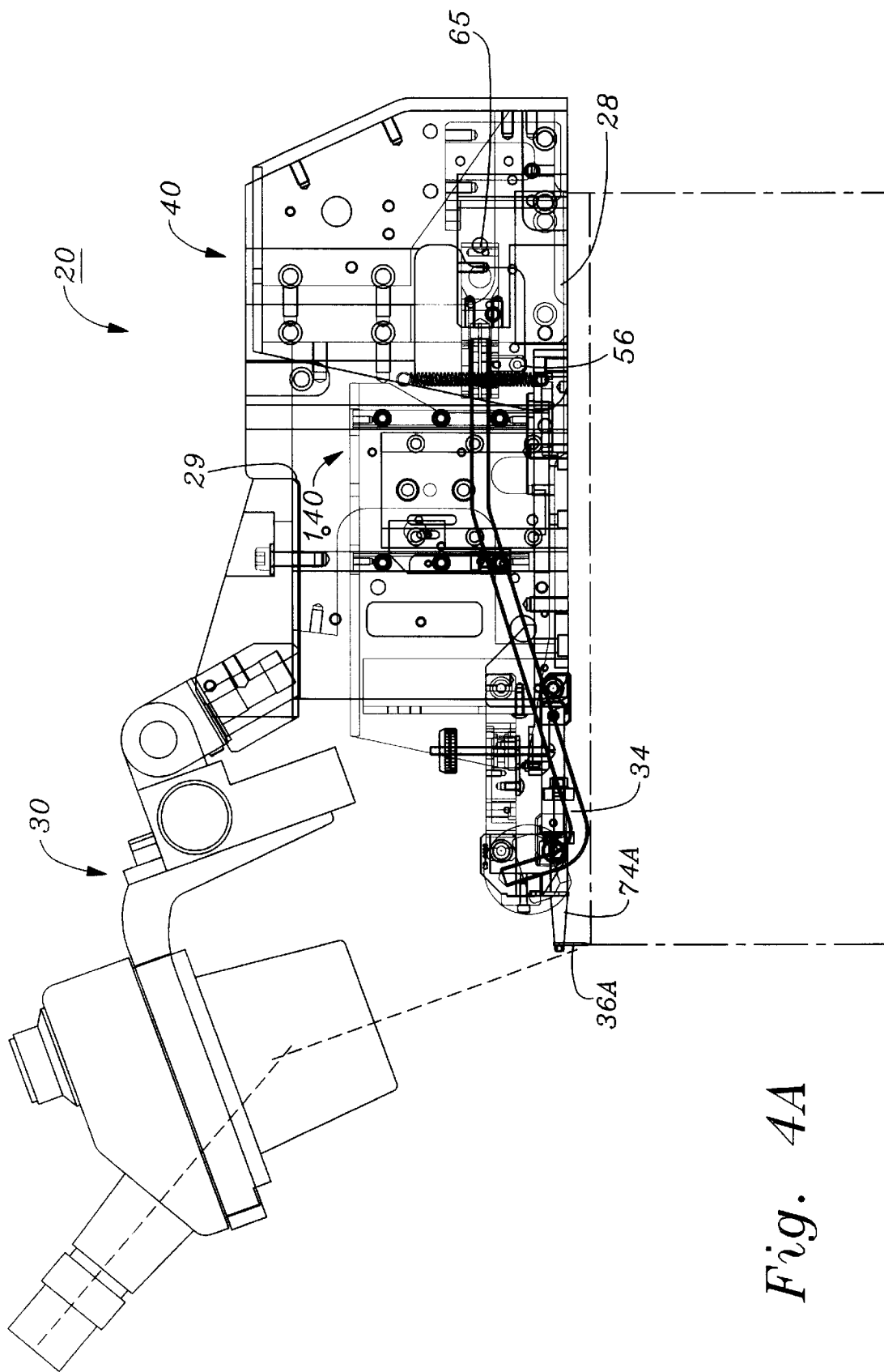
FIG. 4A is a right side elevation view of the apparatus of FIG. 2.
Figure 4B:
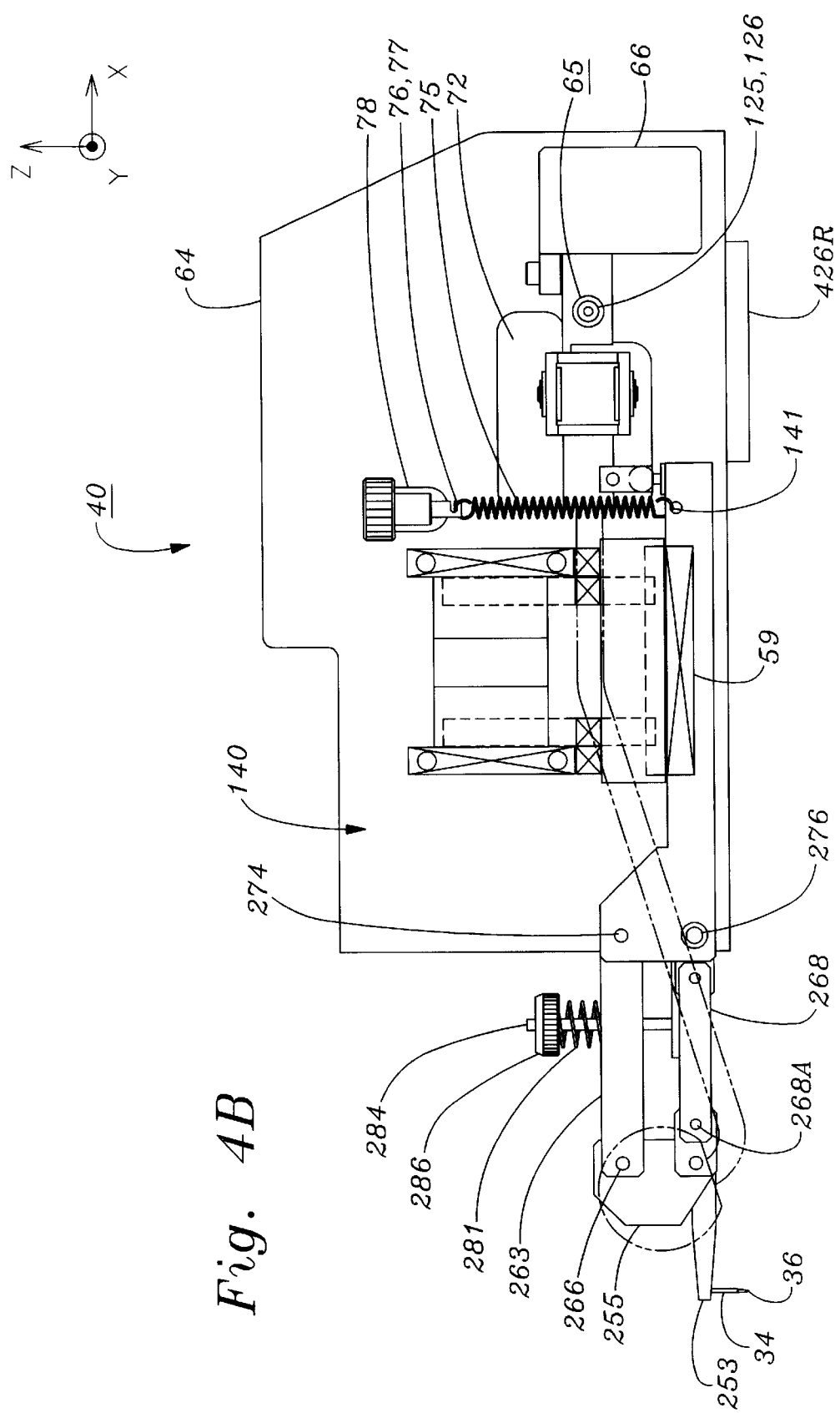
FIG. 4B is a fragmentary right side elevation view of the apparatus of FIG. 2.

Referring still to FIG. 9, short inner linkage bar 46 of input pantograph mechanism 41 may be seen to be pivotably joined at an inner or rear longitudinal end thereof to the inner lateral end of tie bar 44, by means of a third, rear inner pantograph pivot bearing 51 which has an axis parallel to the axes of first pivot bearing 47 and second pivot bearing 49. Inner linkage bar 46 is also pivotably joined to front manipulator beam 43 by a fourth, front inner pantograph pivot bearing 52 which has a pivot axis parallel to the axes of bearings one, two and three. As may be seen best by referring to FIGS. 2, 4 and 9, inner linkage bar 46 also has a section 53 that protrudes forward beyond the front edge of manipulator beam 43, the forward protruding section having a downwardly protruding vertical leg section 54. As shown in FIGS. 2, 4 and 9, vertical leg section 54 of inner linkage bar 46 has protruding perpendicularly downward therefrom a socket 57 for ball joint 56. As shown in FIG. 9, the vertical axis of ball joint 56 is located forward of the axis of fourth, front inner pantograph bearing 52. Ball joint 56 includes a ball 58 that protrudes upwardly from a tool support plate 59, which is described below.

As may be seen best by referring to FIGS. 2 and 9, manipulator beam 43 has an extension portion 60 that protrudes laterally inwardly beyond inner linkage bar 46 and fourth, front inner pantograph pivot joint bearing 52. Extension 60 is pivotably joined by a fifth, pantograph support pivot bearing 61 to a laterally outwardly protruding lug 63 of a pantograph hanger 62. Fifth pivot bearing 61 is parallel to and longitudinally aligned with first and fourth pivot bearings 47 and 52 of pantograph manipulator input mechanism 41.

As may be seen best by referring to FIG. 4 in addition to FIGS. 2 and 9, pantograph hanger 62 is pivotably joined to a vertical support plate 64 by means of a sixth, hanger support pivot bearing 65. The axis of sixth, hanger support pivot bearing 65 is oriented horizontally, i.e., parallel to base plate 21, and serves as the primary support member for manipulator beam 43 and other previously described components of manipulator input pantograph mechanism 41.

Figure 5A:
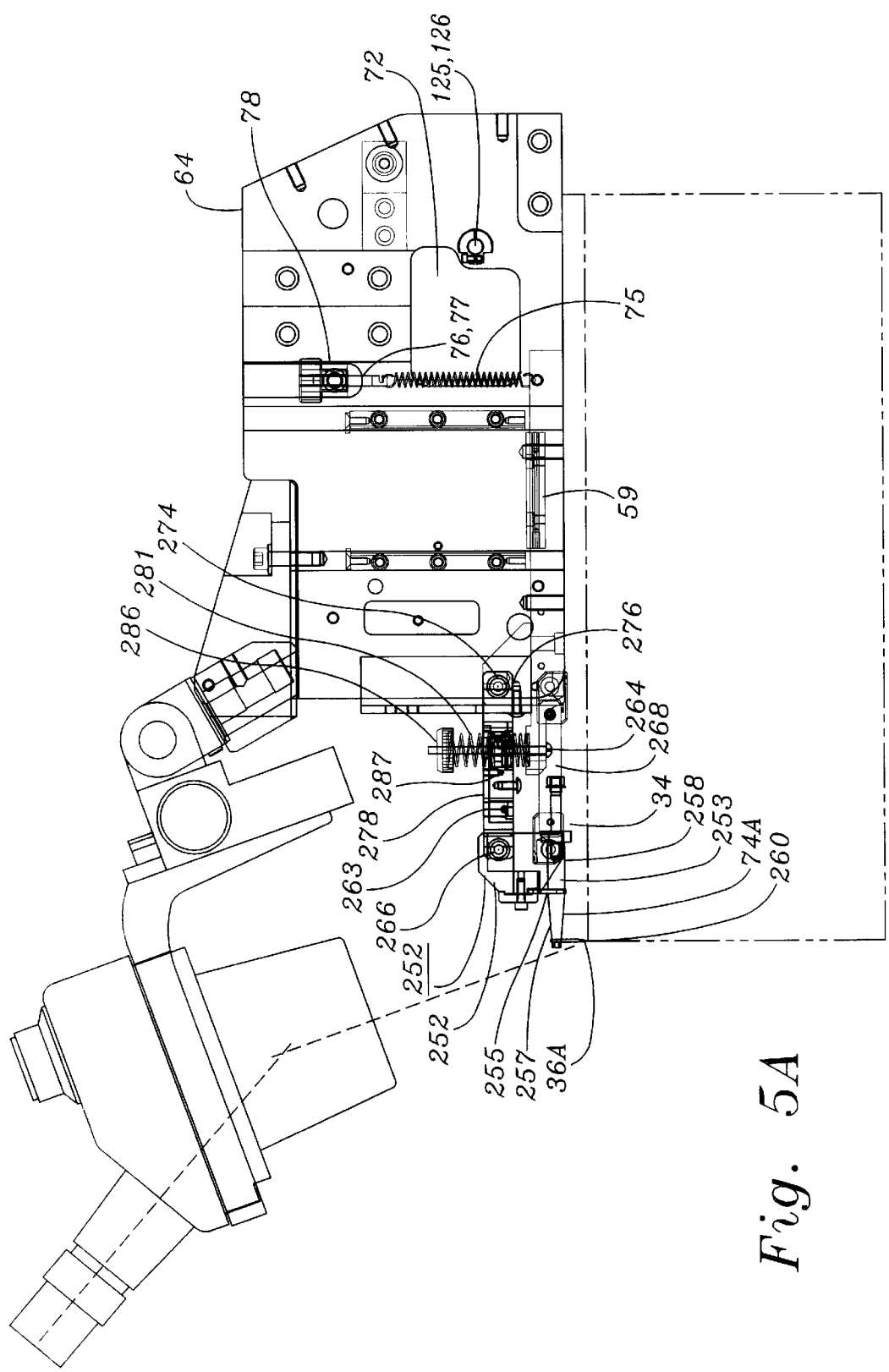
FIG. 5A is a fragmentary right side elevation view of the apparatus of FIG. 2, showing the vertical mounting plate thereof.
Figure 5B:
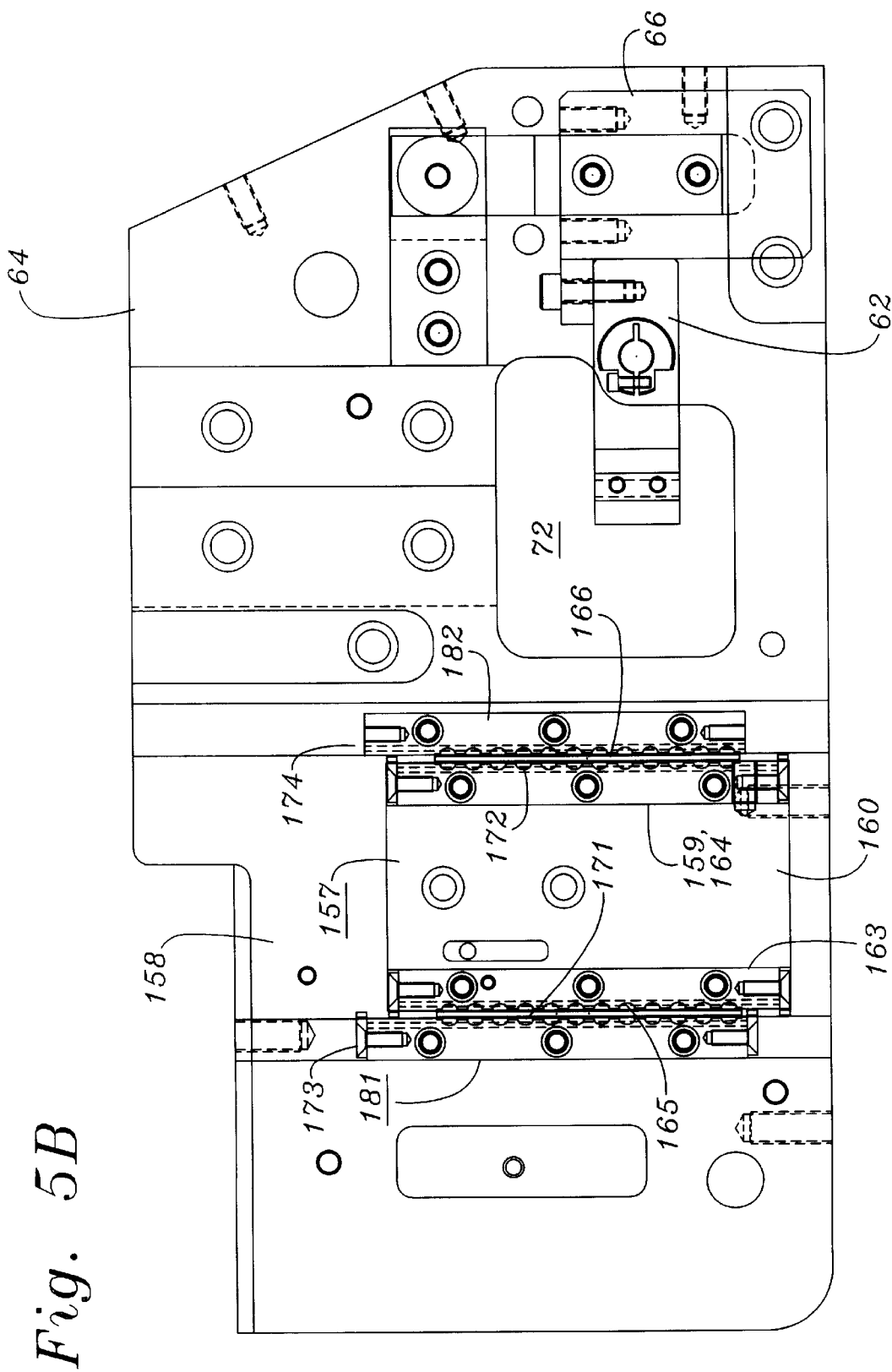
Figure 11:
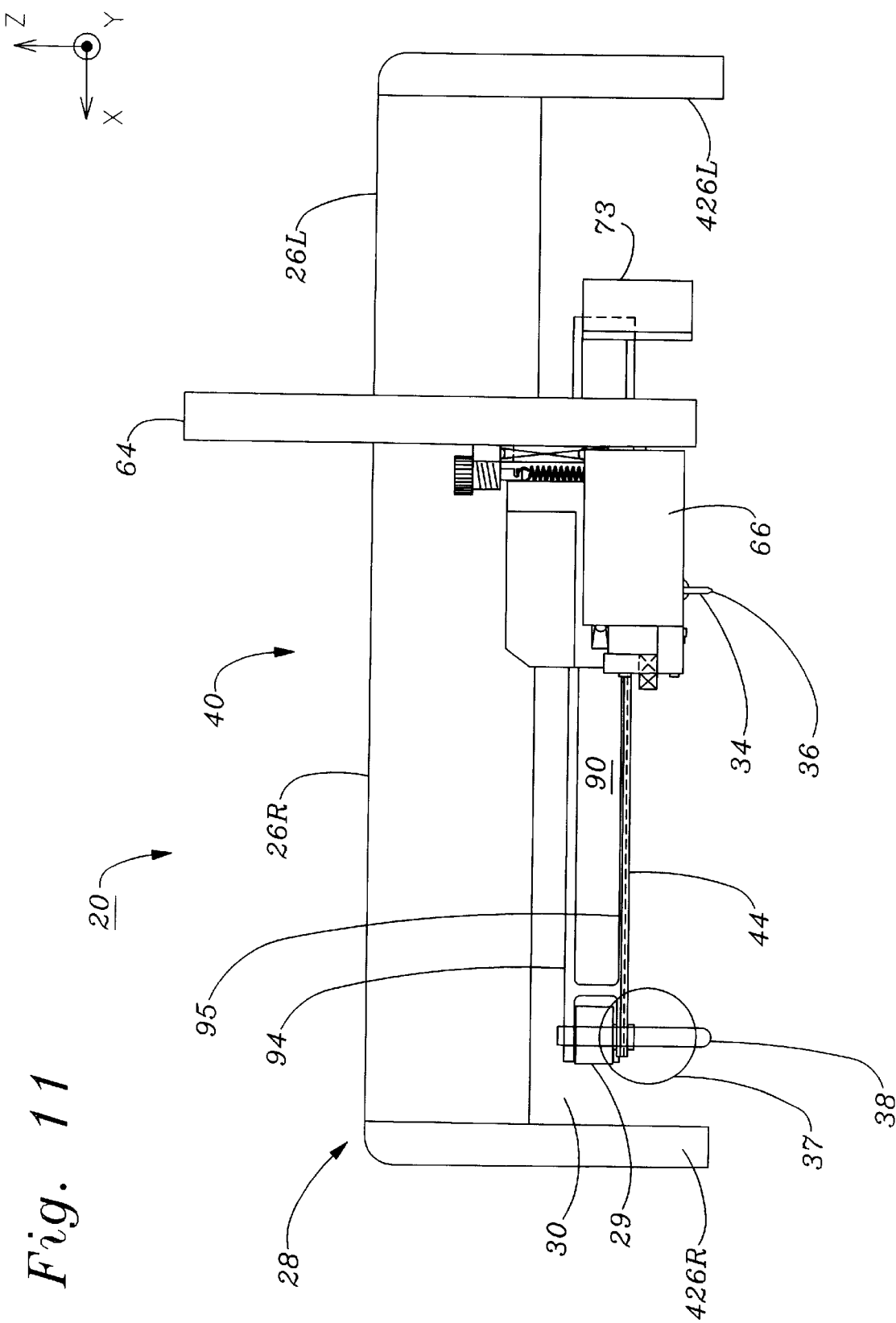
FIG. 11 is a rear elevation view of the apparatus of FIG. 2.
Figure 11A:
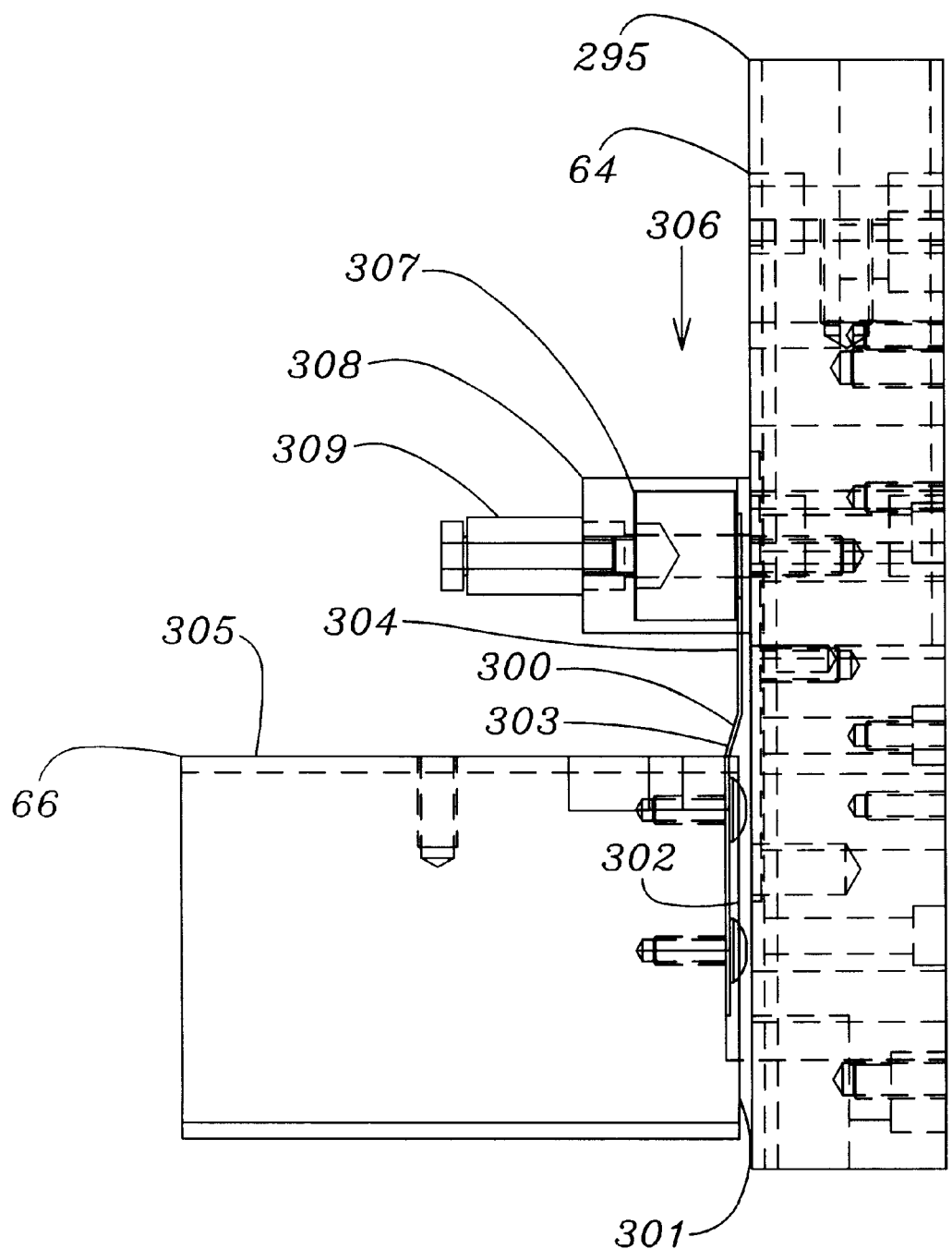
FIG. 11A is a fragmentary rear elevation view of the apparatus of FIG. 2, showing details of a z-axis brake thereof.

As may be seen best by referring to FIG. 5 in addition to FIGS. 9 and 11, extension 60 of manipulator beam 43 protrudes laterally inwards through a generally rectangularly-shaped aperture 72 provided through the thickness dimension of vertical support plate 64. As shown in FIG. 5, aperture 72 is located near the rear and lower edge walls of vertical support plate 64.

As may be seen best by referring to FIGS. 9 and 11, manipulator input mechanism 41 includes a first, Y-axis counterweight 73 located on the left side of vertical support plate 64 is attached to that portion of manipulator beam extension 60 that protrudes through aperture 72 of the support plate. A primary function of Y-axis counterweight 73 is to counter balance the weights of those parts of manipulator input mechanism 41 located lateral outwardly from or on the right hand side of fifth vertical beam support bearing 61. Thus, as viewed from above, as in FIG. 9, counterweight 73 exerts an inertial moment arm about vertical pivot axis 61 which counteracts that of control arm 38 and other parts of manipulator input mechanism 41 located laterally outward from or to the right of the vertical pivot axis. Therefore, when control knob 37 is moved longitudinally inwardly or outwardly parallel to vertical support plate 64, in a Y-axis direction, the tactile response to an operator grasping the control knob will be relatively neutral.

As shown in FIGS. 9 and 11, pantograph input mechanism 41 of micro-manipulator 40 also includes a second, Z-axis counterweight 66. Z-axis counterweight 66 has the shape of a rectangular block, and is attached to the right-hand or outer side wall of pantograph support hanger 62, rearward of horizontally disposed hanger support pivot bearing 65. Z-axis counterweight 66 exerts a clockwise torque on manipulator hanger 62, about the axis of horizontal hanger support bearing 65, as viewed from the right-hand side of vertical support plate. This clockwise torque counteracts the counter-clockwise torques exerted on hanger support bearing 65 by the weight of manipulator input mechanism control arm 38, and other components of the manipulator input mechanism located forward of hanger support bearing 65. Clockwise torque exerted by Z-axis counterweight 66 also counteracts torques produced by the weight of tool support plate 59 and components attached thereto acting through ball joint 56 on manipulator beam 43.

Since, as shown in FIGS. 1 and 2, various ultrasonic bonding tools 34 and ultrasonic transducers 74 may be interchangeably mounted from time to time on tool support plate 59, micro-manipulator apparatus 40 preferably includes means for exerting on the tool support plate an upwardly directed force to compensate for the weight of the tool plate and objects supported by the tool plate. To this end, as shown in FIGS. 2, 4 and 5, a tension spring 75 is provided which is attached at an upper longitudinal end thereof to a threaded screw shank 76 which is threadably received in a threaded bore 77 vertically disposed through a bracket 78 which protrudes laterally outwards from the right side wall of vertical support plate 64. The lower end of spring 75 is attached to the upper surface of a vertical beam slide assembly 141 which supports tool support plate 59 in a manner which is described in detail below.

Further details of the structure and function of input mechanism 41 of micro-manipulator 40 may be best understood by referring to the FIGS. 2 and 9.

As shown in FIGS. 2 and 9, front beam 43 of input pantograph mechanism 41 may be seen to have the shape of a hollow, generally rectangular and preferably square cross-section beam. Preferably, the front, rear, upper and lower side walls of manipulator beam 43 have elongated apertures 90 therethrough to reduce the weight of the manipulator beam. Also, the outer lateral ends of front and rear side walls 91 and 92 of manipulator beam 43 preferably have formed therein a inwardly extending rectangular slot 93. The outer lateral ends of upper and lower side walls 94 and 95, respectively, bounding slot 93 define a bifurcated structure having an opening which receives outer linkage bar 45. First, front outer pantograph pivot bearing 47 pivotably joining outer linkage bar 45 to manipulator beam 43 includes a pivot pin 96 that is received through vertically aligned holes 97 and 98 through the outer bifurcated end portions of upper and lower side walls 94 and 95 of manipulator beam 43, and is held therein by upper and lower E-rings 99 snapped into annular grooves 100 formed in the upper and lower ends of pivot pin 96.

Tie bar 44 of input pantograph mechanism 41 preferably consists of a thin, rectangular cross-section bar, the outer lateral end of which is pivotably fastened to the lower surface of a portion of outer linkage bar 45 that protrudes rearwardly through slotted opening 93 in the outer lateral end of manipulator beam 43, by means of a headed pivot pin 101 which is received in aligned holes provided through the tie bar and into the bottom of the rear linkage bar extension, thus forming rear outer pantograph bearing 49. Similarly, the inner lateral end of tie bar 44 is pivotably attached to the lower surface of an extension portion 102 of inner linkage bar 46 that protrudes rearward through a laterally elongated, rectangularly-shaped aperture 103 provided through the rear side wall 92 of manipulator beam 43, near the inner lateral end of the manipulator arm. This third, rear inner pantograph pivot bearing is formed by a headed pivot pin 104 which is rotatably received in a bronze bearing bushing press fitted into a bearing hole provided through tie bar 44, and anchored in a blind bore provided into the bottom surface of rear extension 102 of inner linkage bar 46.

Inner linkage bar 46 also has a forwardly protruding section 53 that protrudes forward through a rectangularly-shaped aperture 106 provided through front side wall 91 of manipulator beam 43. The central portion of inner linkage bar 46 is pivotably joined to manipulator beam 43 by a fourth, front inner pantograph bearing 52. This bearing is comprised of a pivot axle pin 107 that is received through vertically aligned holes 108 and 109 through the upper and lower side walls 94 and 95 of manipulator beam 43. Pivot axle pin 107 is held in place by upper and lower E-rings snapped into annular ring-shaped grooves 110 formed in the upper and lower ends of pivot axle pin 107.

As shown in FIGS. 2 and 9, forwardly protruding section 53 of inner linkage bar 46, which protrudes forward through aperture 106 in front wall 91 of manipulator beam 43, is terminated at the outer or forward end thereof by a perpendicularly downwardly protruding, vertical leg section 54. Vertical leg section 54 is terminated at the lower end thereof by socket 57 of ball joint 56.

Referring still to FIGS. 2 and 9, it may be seen that lower section 54 of inner linkage bar 46 serves as a coupling bar for coupling input pantograph mechanism 41 to follower mechanism 42, by means of ball joint coupling 56. As shown in FIGS. 2 and 9, ball joint coupling 56 includes a ball 58 having a threaded stud 111 which is threadingly received in the upper wall surface 112 of tool support plate 59,. Ball 58 is received in socket 57 which protrudes downwardly from downwardly protruding leg section 54 of inner linkage bar 46. Socket 57 is formed by the combination of a rigid, hardened steel plate 113 having formed therein a concave depression in an inner surface therein and attached to the left side wall 114 of leg section 54, and a steel leaf spring 115 backed by a rigid steel plate 116 and attached to the right side wall 117 of the leg section.

As shown in FIGS. 2 and 9, it may be seen that manipulator beam 43 has a left lateral end portion or extension 60 that protrudes laterally inwards to the left of fourth, front inner pantograph bearing 52. Front wall 91, and the front portion of upper and lower walls 94 and 95 of the inner end portion of left lateral extension 60 of manipulator beam 43 are cut away to form a laterally rightward extending rectangular slot 118. The leftward protruding lateral ends of upper and lower side walls 94 and 95, respectively, form a bifurcated structure having an opening which receives rectangular cross-section lug 633 that protrudes laterally outwards from manipulator arm hanger 62. Fifth, pantograph mechanism support bearing 61 joining inner end 60 of manipulator beam 43 to lug 63 of manipulator arm hanger 62 includes a pivot axle pin 119 that is received through vertically aligned holes 120 and 121 through the bifurcated end portion of upper and lower side walls 94 and 95 of the manipulator beam. Axle pin 119 is held in place by upper and lower E-rings 122 snapped into annular grooves 123 formed in the upper and lower ends of the pivot axle pin. Thus constructed, manipulator beam 43 may be pivoted rearward about hanger lug 63, since front wall 91 adjacent to slot 118 is cut away. However, since rear wall 92 of manipulator beam 43, as well as rear portions of upper and lower side walls 94 and 95 of arm extension 60 protruding leftward beyond slot 118 are left intact, rearward pivotal motion of the manipulator arm is made possible by providing a laterally elongated, rectangularly-shaped aperture 124 through rear wall 92 of the beam, rearward of hanger lug 63, the aperture allowing rearward movement of the hanger lug therethrough, as shown in FIG. 11.

As shown in FIGS. 2 and 9, manipulator beam hanger 62 is pivotably joined by sixth, hanger support bearing 65 to vertical support plate 64. Bearing 65 comprises an axle pin 125 that protrudes laterally through a bore 126 inward to the left of manipulator hanger 62, the axle pin being held fixed by means of a set screw 127 screwed into a threaded bore that intersects the axle pin bore. Axle pin 125 is rotatably held in a journal 129 that is in turn held within a bore 130 through vertical support plate 64. Axle pin 125 is maintained in a fixed longitudinal position by means of a clamp 131 which grips the axle pin. Clamp 131 has an annular face which bears against a friction adjusting washer 132, the opposite annular surface of the washer bearing against the inner annular end wall of journal 129.

As may be seen best by referring to FIGS. 6, 7, 9 and 11, rear wall portion 92 and cut-back upper and lower walls 94 and 95 of inner extension 60 of manipulator beam 43 protrude laterally inward through aperture 72 provided through the rear portion of vertical support plate 64. Here the end portion of front beam side wall 91 is fastened by screws 133 to the front wall surface of counterweight 73.

The structure of manipulator input mechanism 41 of micro-manipulator 40 having been described above, a description of the structure and function of follower mechanism 42 of the micro-manipulator will now be given, followed by a functional description of the entire micro-manipulator apparatus.

Figure 7A:
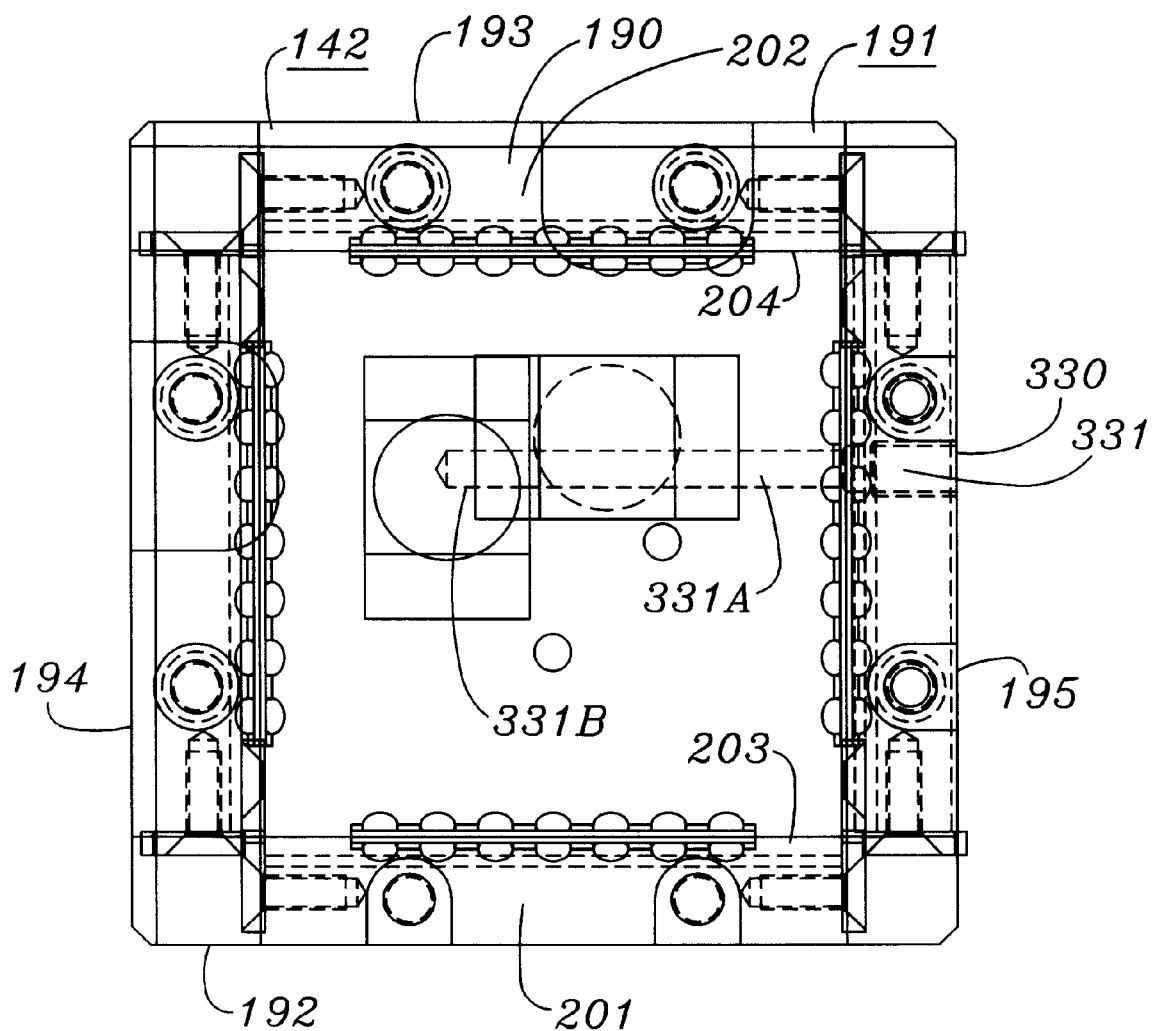
FIG. 7A is a fragmentary upper plan view of the apparatus of FIG. 2, showing orthogonal linear bearing structures thereof.
Figure 8B:
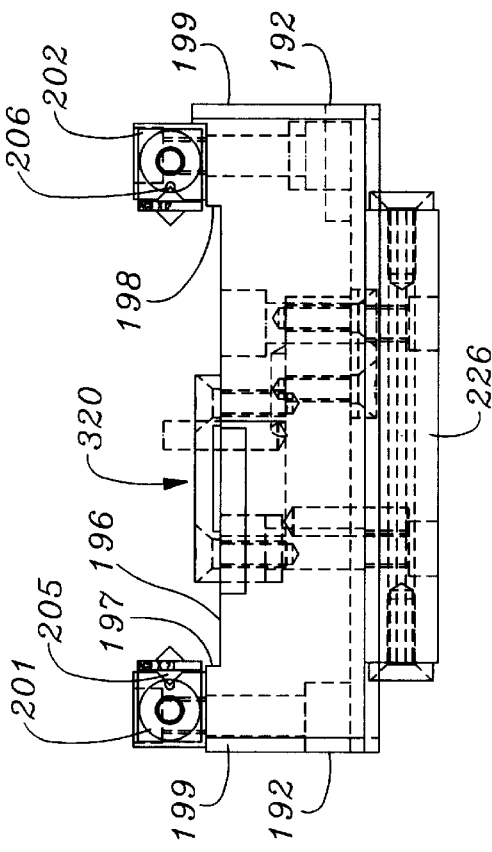
FIG. 8B is a side elevation view of the article of FIG. 8A.

Referring now primarily to FIGS. 2, 7 and 8, follower mechanism 42 of micro-manipulator 40 may be seen to include a vertically cascaded bearing structure assembly 140 consisting of three orthogonally acting, linear bearing slide structures attached to the right-hand side of vertical support plate 64. Cascaded bearing structure assembly 140 includes a first, upper linear bearing structure 141 attached to the right-hand side of vertical support plate 64, and rollingly translatable in a vertical, Z-axis direction with respect to the vertical support plate 64. Cascaded bearing structure assembly 140 also includes a second, intermediate linear bearing structure 142, which is fastened to the underside of first, Z-axis bearing structure 141, and which is rollingly translatable in a lateral, X-axis direction with respect to the first linear bearing structure. The third, lowest linear bearing slide of cascaded bearing structure assembly 140 comprises a tool support plate 59 which is fastened to the underside of second, X-axis intermediate bearing structure 142. Tool support plate 59 is rollingly translatable in a longitudinal, fore and aft, Y-axis direction with respect to intermediate linear bearing structure 142.

As may be seen best by referring to FIGS. 4, 5, 7, 8, 9 and 10, first vertical acting or Z-axis bearing structure 141 includes a horizontally disposed base plate 144 having in plan view the shape of a laterally elongated rectangular block of generally uniform thickness. Vertical bearing structure 141 also includes a vertically disposed mounting plate 145 having in front elevation view the shape of a laterally elongated generally rectangularly shaped block of generally uniform thickness. As shown in FIG. 7, mounting plate 145 has a left vertical side wall 146 coplanar with left vertical side wall 147 of base plate 144. As shown in FIGS. 4 and 7, vertical mounting plate 145 of vertical bearing structure 141 protrudes perpendicularly upwardly from upper surface 148 of base plate 144. Front and rear side walls 149 and 150 of vertical mounting plate 145 are parallel to and equidistant from front and rear walls 151 and 152 of base plate 144. As shown in the figures, vertical mounting plate 145 has a right-hand vertical wall 155 spaced laterally outwardly from right-hand vertical wall 154 of base plate 144. Vertical mounting plate 145 also has a horizontally disposed upper wall 155, and a diagonally disposed upper right-hand corner wall 156.

As may be seen best by referring to FIGS. 4 and 7, Z-axis bearing structure 141 is attached to a Z-axis vertical bearing slide 157, which is in turn vertically slidably mounted to right-hand wall surface 158 of vertical support plate 64. As shown in FIGS. 4, 5, 7 and 9, vertical bearing slide 157 includes a slidable plate 159 disposed parallel to right-hand wall 158 of vertical support 64. As may be seen best by referring to FIGS. 7 and 9, vertical bearing slide plate 159 has a vertically elongated rectangular shape and is of generally uniform thickness, with a flat outer wall surface 160 and front and rear parallel edge wall surfaces 161 and 162 disposed perpendicularly to the outer wall surface. Plate 159 has formed at the intersection of its outer wall 160 and front and rear walls 161 and 162, respectively, a pair of parallel, longitudinally spaced apart, laterally disposed, L-cross section front and rear bearing block mounting grooves 161 and 162, respectively. As shown in FIGS. 4 and 9, front and rear bearing block mounting grooves 161 and 162 have fastened therein front and rear inner vertical linear bearing blocks 163 and 164. Inner bearing blocks 163 and 164 have a vertically elongated, rectangular cross section shape and have formed in the outer vertical faces 165 and 166 thereof longitudinally disposed, generally V-shaped grooves 167 and 168. Referring still to FIGS. 4 and 9, it may be seen that vertical Z-axis slide support structure 141 includes a pair of front and rear vertically disposed, longitudinally spaced apart outer linear bearing blocks 169 and 170 attached to right-hand wall 158 of vertical support plate 64. Outer, Z-axis bearing blocks 169 and 170 are longitudinally spaced apart, and disposed vertically and parallel to right-hand wall 158 of vertical support plate 64. Front and rear outer linear bearing blocks 169 and 170 have in the inner facing surfaces 171 and 172 thereof V-shaped grooves 173 and 174, respectively, shaped similarly to grooves 167 and 168 of inner bearing blocks 163 and 164.

As may be seen best by referring to FIGS. 7 and 9, slide plate 159 of Z-axis bearing slide 157 is positioned with the slide plate 159 disposed parallel to right-hand wall surface 158 of vertical support plate 64. As is also shown in those figures, Z-axis bearing slide plate 159 is located longitudinally between front and rear outer vertically disposed outer linear bearing blocks 169 and 170, with outer, front face 165 of front inner bearing block 163 adjacent rear, inner face 171 of front outer linear bearing block 169, and with outer, rear face 166 of rear inner bearing block 164 adjacent front, inner face 172 of rear outer linear bearing block 170. Thus positioned, V-shaped groove 167 in front face 165 of front inner linear bearing block 163 is located adjacent to V-shaped groove 173 in rear face 171 of front outer linear bearing block 169, forming therewith a generally rectangularly shaped composite bearing way 167–173.

As shown in FIGS. 7 and 9 composite bearing way 167–173 holds therein a longitudinally elongated roller bearing cage 175. Roller bearing cage 175 contains a row of longitudinally spaced apart, cylindrical roller bearings 176. As may be seen best by referring to FIG. 7, roller bearings 176 are right circular cylinders each having a diameter equal to its height. The axes of odd number cylindrical roller bearings 176 are parallel to a first face of a V-shaped bearing block groove such as groove 173 of bearing block 169, while the axes of even number cylindrical roller bearings are parallel to the second face of the bearing way groove. The combination of front inner vertical bearing block 163, front outer bearing block 169, cylindrical roller bearing cage 175 and cylindrical roller bearings 176 comprises a front vertical or Z-axis linear bearing assembly 181. Similarly, the combination of rear inner vertical bearing block 164, rear outer bearing block 170, a cylindrical roller bearing cage 175 and cylindrical roller bearings 176 comprise a rear vertical or Z-axis bearing assembly 182. The two bearing assemblies together permit vertical, Z-axis bearing support structure 141 to roll freely up and down in a Z-axis direction in response to motions of input manipulator input mechanism 41 coupled through ball joint 56 to tool support plate 59, in a manner which will be described in detail below.

Referring now to FIGS. 4, 5, 7 and 8, it may be seen that second, intermediate or middle, X-axis linear bearing structure 142 is rollingly fastened to the underside of upper, Z-axis linear bearing structure 141 as follows.

As shown in FIGS. 7 and 8, X-axis bearing structure assembly 142 includes a longitudinally disposed, X-axis slide 190 which has in upper plan view the shape of a square plate 191 of relatively uniform thickness. As shown in FIGS. 7 and 8, X-axis slide plate 191 has vertically disposed, parallel front and rear walls 192 and 193, respectively.

X-axis slide plate 191 also has parallel, vertically disposed left and right side walls 194 and 195, respectively, which are perpendicular to the front and rear side walls of the slide plate. Slide plate 191 has protruding upwardly from upper surface 196 of the slide plate a pair of laterally elongated and disposed, rectangular cross section front and rear bearing block mounting bosses 197 and 198, respectively. Front surface 199 of front bearing block mounting boss 197 is flush with front surface 192 of slide plate 191, and rear surface 200 of rear bearing block mounting boss 198 is flush with rear surface 193 of the slide plate. Front and rear bearing block mounting bosses 197 and 198 have mounted thereon front and rear outer horizontally and laterally disposed, longitudinally spaced apart front and rear outer X-axis bearing blocks 201 and 202, respectively. Bearing blocks 201 and 202 are similar in construction to front and rear outer Z-axis linear bearing blocks 169 and 170 described above. Thus, bearing blocks 201 and 202 have a laterally enlarged, rectangular cross section shape and have formed in the inner facing vertical walls 203 and 204 thereof V-shaped grooves 205 and 206, respectively.

Referring still to FIGS. 7 and 8, it may be seen that front outer X-axis bearing block 201 is mated with a front inner bearing block 207 attached to front lower lateral edge of horizontal base plate 144 of Z-axis bearing structure 141. Similarly, rear outer X-axis bearing block 202 mates with a rear inner bearing block 208 attached to the rear lower lateral edge of base plate 144. Front and rear inner X-axis bearing blocks 207 and 208 are secured in laterally elongated rectangular cross-section front and rear bearing block mounting grooves 209 and 210, respectively, formed at the intersection of lower wall surface 211 of base plate 144 with the front and rear walls 212 and 213, respectively, of the base plate.

Front and rear inner X-axis bearing blocks 207 and 208 have formed in the outer vertical faces 214 and 215 thereof longitudinally disposed, generally V-shaped grooves 214 and 215. Also, as shown in FIGS. 2, 7 and 8, horizontal base plate 144 of Z-axis bearing structure 141 is located longitudinally between front and rear outer X-axis bearing blocks 201 and 202 on X-axis slide plate 191. Thus positioned, V-shaped groove 205 in rear face 203 of front outer X-axis bearing block 201, which protrudes upward from X-axis slide 191 is located adjacent to V-shaped groove 214 in the rear face of front inner bearing block 207, which protrudes downward from base plate 144 of Z-axis bearing structure 141. Adjacent V-shaped grooves 205 and 214 form in combination a generally rectangularly-shaped composite bearing way 205–214. In a construction exactly similar to that described above, in which front inner and outer Z-axis bearing blocks 163 and 169 contain therebetween a roller cage 175 and roller bearings 176 to form an operative Z-axis linear bearing assembly 181, mating bearing blocks 201 and 207 containing therebetween a roller cage and roller bearings to form an operative front X-axis linear bearing assembly 216. In an exactly analogous fashion, rear X-axis linear bearing blocks 202 and 208 and associated roller bearing cage and roller bearings form a rear X-axis linear bearing assembly 217. The two bearing assemblies together permit intermediate, or middle, X-axis linear bearing support structure 142 to roll freely in a lateral, X-axis direction in response to motions of manipulator input mechanism 41.

Referring again to FIGS. 7 and 8, it may be seen that slide plate 191 of X-axis bearing structure 142 has protruding downwardly from the lower surface 218 of the slide plate a pair of longitudinally elongated and disposed, rectangular cross-section left and right Y-axis bearing block mounting bosses 219 and 220, respectively. Left surface 221 of left Y-axis bearing block mounting boss 219 is parallel to and offset inwardly from left-hand wall surface 222 of slide plate 191. Also, right-hand surface 223 of right-hand Y-axis bearing block mounting boss 220 is parallel to and offset inwardly from right-hand wall surface 224 of slide plate 191. Left and right Y-axis bearing block mounting bosses 219 and 220 have mounted thereon left and right downwardly protruding longitudinally disposed, laterally spaced apart left and right outer bearing blocks 225 and 226, respectively. Bearing blocks 225 and 226 are similar in construction to front and rear outer Z-axis linear bearing blocks 169 and 170 described above. Thus, outer Y-axis linear bearing blocks 225 and 226 have a longitudinally elongated rectangular cross-sectional shape and have formed in the inner facing vertical wall surfaces 227 and 228 thereof V-shaped grooves 229 and 230, respectively.

Referring still to FIGS. 7 and 8, it may be seen that left outer Y-axis bearing blocks 225 mates with a left inner bearing block 231 which is attached to the longitudinally disposed, upper left corner edge of horizontally disposed tool support plate 59, which comprises a Y-axis slide plate. Similarly, right outer Y-axis bearing block 226 mates with a right-hand inner Y-axis bearing block 232 which is attached to the longitudinally disposed upper right corner edge of tool support plate 59. Left and right inner Y-axis bearing blocks 231 and 232 are secured in longitudinally elongated, rectangular cross-section left and right bearing block mounting grooves 233 and 234, respectively formed at the intersection of upper wall surface 235 of the tool support plate with the left and right side walls 236 and 237, respectively of the tool support plate.

Left and right inner Y-axis bearing blocks 231 and 232 have formed in the outer longitudinally disposed vertical faces 238 and 239 thereof longitudinally disposed generally V-shaped grooves 240 and 241. Also, as shown in FIGS. 2 and 7, Y-axis slide/tool support plate 59 is located laterally between left and right outer Y-axis bearing blocks 225 and 226. Thus positioned, V-shaped groove 229 in left, longitudinally disposed outer Y-axis bearing block 225 which protrudes downward from X-axis slide plate 191 is located adjacent to V-shaped groove 240 of the outer, left-hand base of left inner bearing block 231 which protrudes upward from Y-axis slide tool support plate 59. Adjacent V-shaped grooves 229 and 240 form in combination a generally rectangularly-shaped composite bearing way 229–240.

In a construction exactly similar to that described above, in which front linear Z-axis bearing blocks 163 and 169 contain therebetween a roller cage 175 and roller bearings 176 to form an operative linear Z-axis bearing assembly 181, mating bearing blocks 225 and 231 contain therebetween a roller cage and roller bearings to form an operative left linear Y-axis bearing assembly 242. In an exactly analogous fashion, right Y-axis linear bearing blocks 226 and 232 form a right-hand Y-axis linear bearing assembly 243. The two linear Y-axis bearing assemblies together permit bottom, Y-axis slide/tool support plate 59 to roll freely in a fore-and-aft, Y-axis direction, along with the overlying X-axis bearing support structure 142, in response to motions of manipulator input mechanism 41.

Referring now to FIGS. 1, 2, 3, 6 and 9, micro-manipulator apparatus 40 may be seen to preferably include a transducer mount assembly 250 for holding an ultrasonic transducer 74, and attached ultrasonic bonding tool 34. As shown in those figures, transducer mount assembly 250 includes a vertically elongated, generally block-shaped body 252. Transducer 74 has a longitudinally elongated, generally cylindrically-shaped body 253 of varying diameter, and has a front portion 257 which protrudes horizontally forward from the front wall 255 of transducer mount assembly 250, centered between the left and right side walls 256 and 257, and proximate the lower wall 258 thereof. Ultrasonic bonding tool 34 protrudes vertically downwards from transducer 74, inward from the front outer end wall of the transducer.

As may be seen best by referring to FIG. 5, transducer 74 protrudes forward from the front laterally disposed edge wall 259 of tool support plate/Y-axis slide 59, and is attached to the tool support plate by a coupling structure 250A which is kinematically equivalent to a cantilevered 4-bar linkage 261. The purpose of this coupling structure is to permit upward movement of tip 260 of ultrasonic bonding tool 34 in response to contact of the tool tip with the upper surface of a bonding site on a workpiece, while precluding accompanying motions in other coordinate directions, the latter motions being undesirable because movement of the tool tip in the "X" or "Y" directions, such as would result from using a simple pivot joint, would deflect the tool tip from its intended location above a bond site, and would exert shear forces on the wire bond formed at that site.

As shown in FIG. 5, coupling structure 250A includes body 252 of transducer mount assembly 250. Body 252 functions as a front vertically disposed "bar" of 4-bar linkage 261. Coupler 250A includes a generally rectangularly-shaped, longitudinally elongated, horizontally disposed transducer mount assembly support body 278 having formed in the front laterally disposed edge wall 278A thereof a rectangularly-shaped notch 278B which receives transducer mount body 257. Support body 278 has at opposite lateral sides thereof perpendicular downwardly depending, longitudinally elongated rectangular left and right side flanges 262 and 263, respectively. Flanges 262 and 263 function as a pair of parallel longitudinally disposed upper linkage bars, and are pivotably coupled at the front ends thereof to left and right side walls 256 and 257 of transducer mount assembly 250, near the upper wall 264 thereof, by a pair of laterally opposed, laterally disposed and aligned, elongated left and right front upper pivot bearings 265 and 266. Pivot bearings 265 and 266 are preloaded by opposing tapered pivot pins, and secured by dutch keys.

Four-bar linkage 261 includes a lower longitudinally elongated, plate-shaped lower linkage bar 268, disposed parallel to and below right-hand flange 263 comprising the upper linkage bar of the four-bar linkage. Lower linkage bar 268 is pivotably coupled at the front end thereof to right side wall 257 of transducer mount assembly 250, near lower wall 258 thereof, by a laterally disposed, elongated right front lower pivot bearing 268A. Pivot bearing 268A is preloaded by a tapered pivot pin, and secured by a dutch key. Four-bar linkage 261 is fastened at the inner or rear longitudinal end thereof to the front longitudinal end of tool support/Y-axis slide 59, as follows.

Figure 5D:
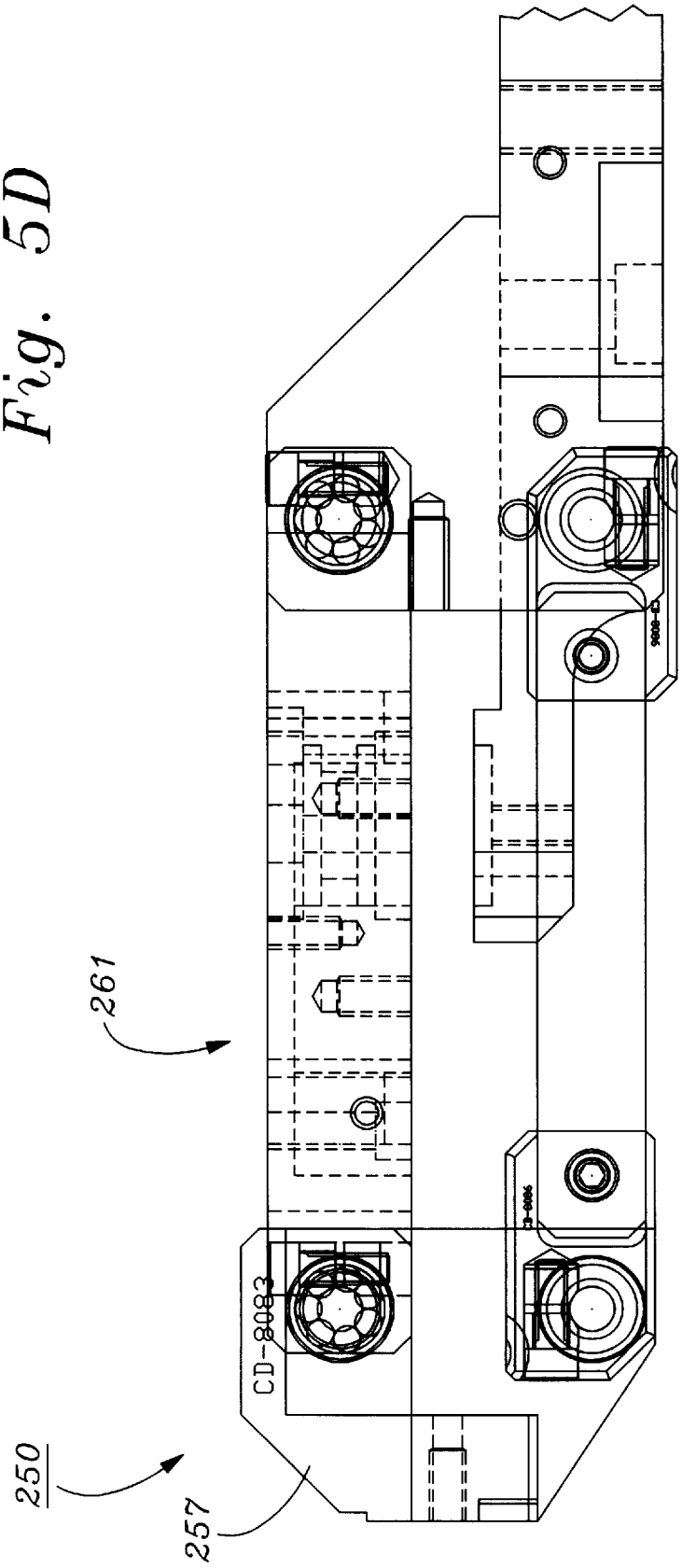
Figure 6A:
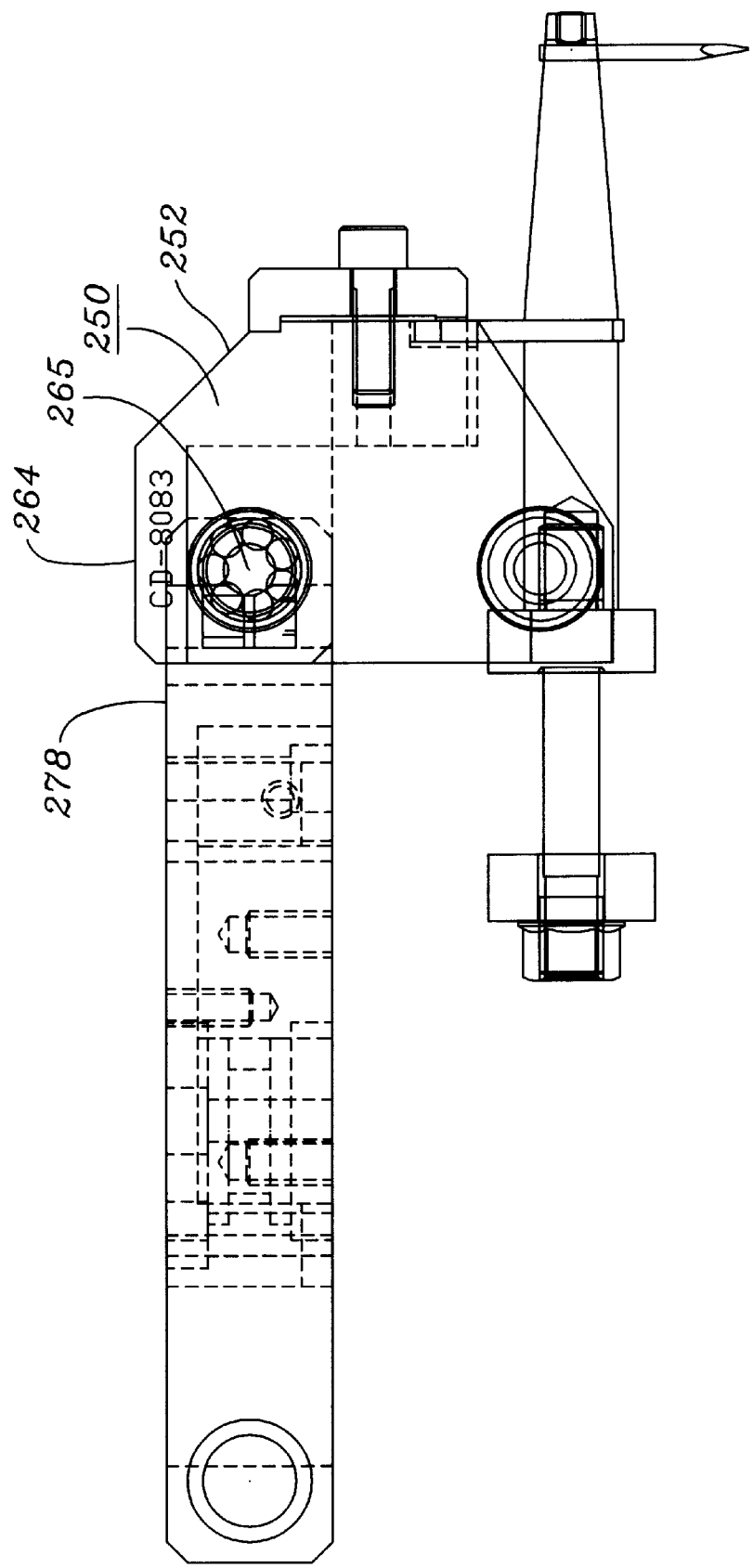
FIG. 6A is a fragmentary right side elevation view of the apparatus of FIG. 2, on an enlarged scale.

Referring now to FIGS. 5 and 9, it may be seen that tool support plate/Y-axis slide 59 has protruding from the upper surface 235 thereof left and right trapezoidally-shaped, pivot mounting flanges 269 and 270, the latter serving as the rear vertical linkage bar of four-bar linkage 261. Left and right rear linkage pivot mounting flanges 269 and 270 have left and right outer flange surfaces 271 and 272, respectively, which are flush with left and right side outer wall surfaces 236 and 237, respectively, of tool support plate 59. Left and right upper linkage bars 262 and 263 are pivotably mounted to outer flange wall surfaces 271 and 272, respectively, near the upper ends of flanges 269 and 270, by a pair of laterally opposed and aligned left and right, upper rear pivot pins 273 and 274, respectively. In a similar fashion, right lower linkage bar 268 is pivotably mounted to outer flange wall surfaces 272, near the lower end of flange 270, by a lower pivot pin 276. As shown in FIG. 5D, four-bar linkage 261 is comprised of a first, front vertical bar consisting of transducer body 252, a second, upper horizontal bar consisting of right side flange 263 of support body 278, a third, rear vertical bar consisting of right trapezoidal mounting flange 270 and the front portion of tool support plate 59, and a fourth, lower horizontal bar consisting of right lower linkage bar 260.

As may be understood best by referring to FIG. 5, the arrangement of linkage bars and pivot pins of four-bar linkage 261 described above allows ultrasonic bonding tool 34 to move in a purely vertical direction along the longitudinal axis of the tool, in reaction to contact of the tip 34A of the tool with a workpiece, and downward motion of the tool relative to the workpiece.

Figure 10:
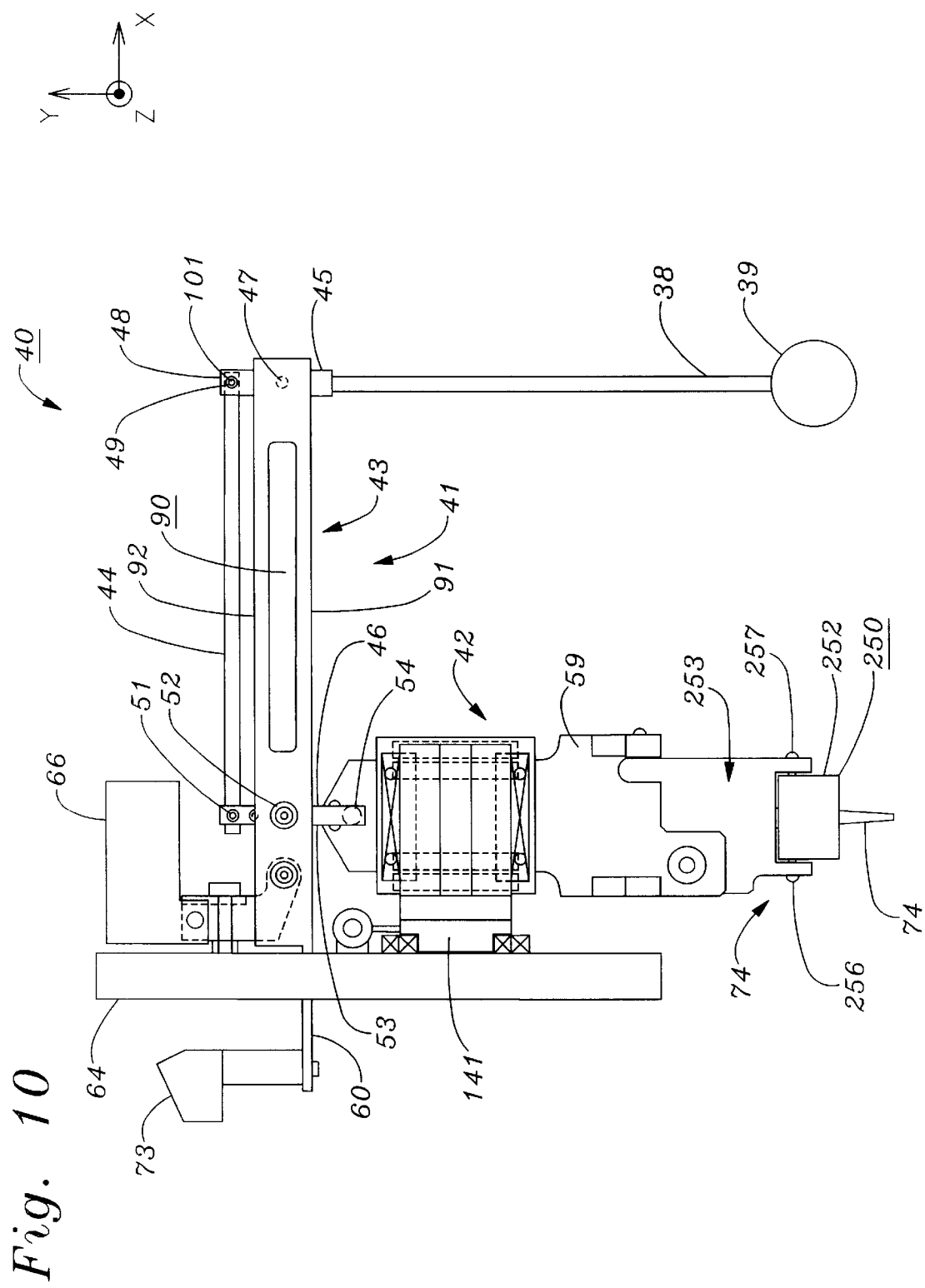
FIG. 10 is a fragmentary upper plan view of the apparatus of FIG. 2, showing a tool support slide thereof.

Preferably, transducer mount assembly 250 of micro-manipulator apparatus 40 is resiliently supported above the upper surface 235 of tool support plate 59. Thus, as shown in FIGS. 5, 7 and 10, horizontally disposed support body 278 has formed near the left rear corner 270 thereof a countersunk hole 280, which receives the lower transverse end coil of an open coil, helical compression spring 281. Hole 280 is vertically aligned with a hole 282 provided through the thickness dimension of a spring support flange 283 which protrudes forward from the left side of front wall 259 of tool support plate 59. A screw 284 has a shank 285 which protrudes upwardly through flange hole 282, through hole 280 and spring 281, and has a thumbscrew 286 threadably attached to the upper end of the shank. Pivotal upward motion of four-bar linkage assembly 261 and cover plate 278 thereof is opposed by a compression force exerted between thumbscrew 286 and support body 278 by spring 281. Using thumbscrew 286 to adjust the compressive pre-load in spring 281, the magnitude of a downward force exerted on a workpiece by tool tip 37 may be limited to a pre-determined value, above which value four-bar linkage assembly 261, and transducer mount assembly 250 and tool 34 attached to the linkage assembly pivot upwardly.

In a preferred embodiment of micro-manipulator apparatus 40, upward pivotal motion of transducer mount assembly 250 in response to contact of tool tip 34A with a workpiece at a pre-determined compressive force actuates an electrical switch 287 having normally closed upper and lower contacts 288 and 289, respectively. Opening of switch contacts 288 and 289 is used to initiate application of a pulse of electric current of a predetermined duration to ultrasonic transducer 74, thus causing a pre-determined pulse of ultrasonic bonding energy to be delivered by ultrasonic tool tip 34A to a selected bond site on the workpiece.

The foregoing method of initiating delivery of a predetermined quantity of bonding energy to a bonding site has proven to result in the formation of high quality wire bonds. However, it has been observed that some operators, particularly when relatively inexperienced, cease downward advancement of tool tip 34A immediately upon visually perceiving, through microscope 30, contact of a wire, which is pushed downwards by the tool tip towards a bonding site, with the bond site. This tendency for the operator to hold back, i.e., prematurely terminate downward motion of tool tip 34A, can result in poor quality bonds, for the following reasons.

In welding a wire to a bond site by the application of ultrasonic or thermosonic energy, the transducer tool tip that delivers energy to the wire and bond site must be moved downward sufficiently far beyond initial contact with the wire to cause the wire to compress slightly during the delivery of energy by the bonding pulse. If this deformation is not accompanied by a small additional downward motion of the tool tip, force exerted by the tool tip is released upon re-contact of switch 287. With downward bonding force thus interrupted, transfer of ultrasonic bonding energy to the wire and bond site is ineffective, resulting in a poor quality bond.

In recognition of the problem described above, the present inventor has devised an improved bonding method, which assures formation of high-quality bonds even when micro-manipulator apparatus 40 is used by a relatively inexperienced operator.

Figure 12:
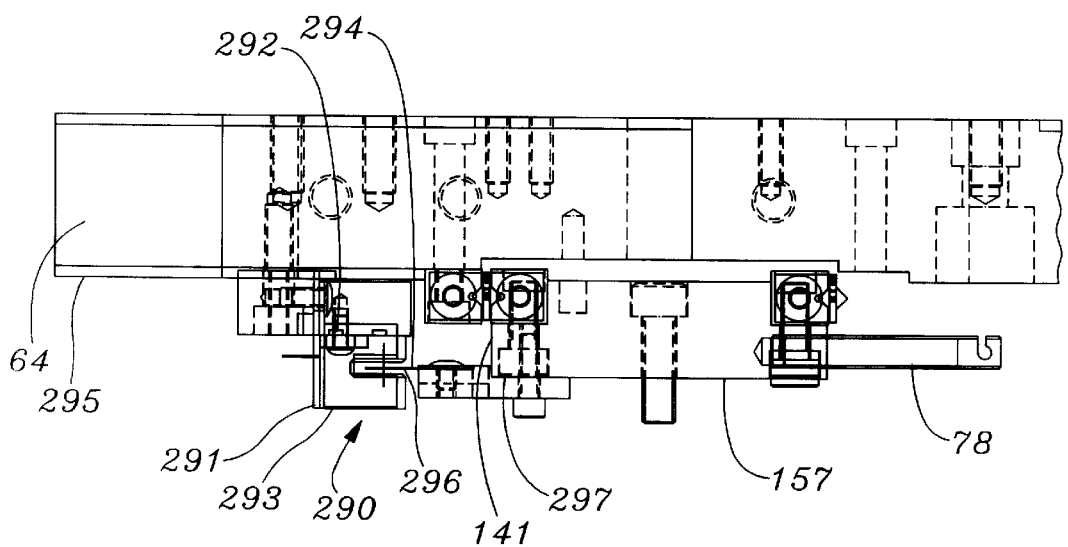
FIG. 12 is a fragmentary upper plan view of the apparatus of FIG. 2, showing details of a z-axis encoder thereof.
Figure 13:
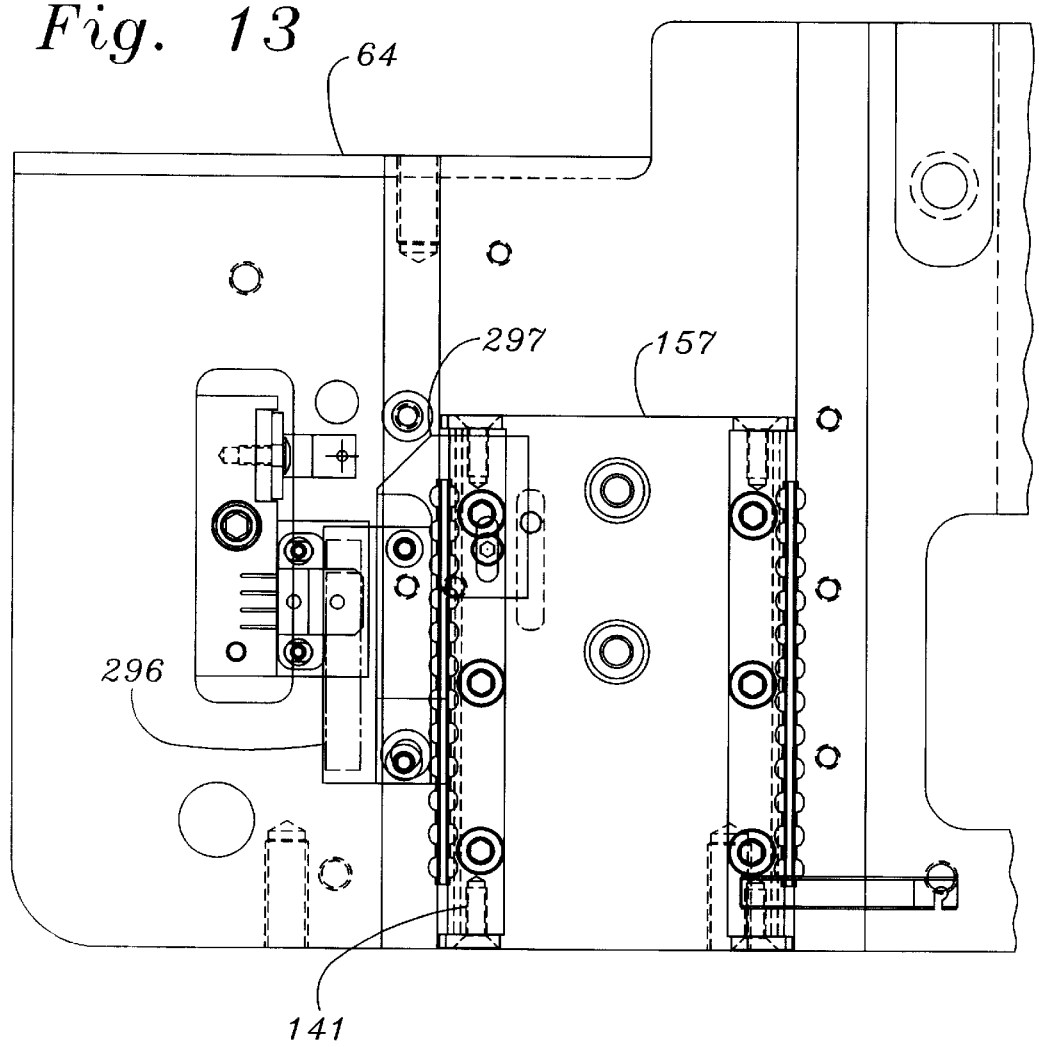
FIG. 13 is a right side elevation view of the structure of FIG. 12.

Referring now to FIGS. 12 and 13, it may be seen that an improved apparatus for initiating bonding energy pulses in micro-manipulator apparatus 40 includes a position sensor 290 for monitoring the Z-axis position of transducer tool tip 34A. As shown in FIGS. 12 and 13, Z-axis position sensor 290 includes an optical encoder module 291 comprising a light source 292 and photo-diode array 293 spaced on opposite sides of a slot 294. Encoder module 291 is fastened to right side wall 295 of vertical support plate 64. Position sensor 290 includes a linear code strip 296 comprising a thin elongated rectangular strip of material having a plurality of transversely disposed transparent bars alternating with opaque bars. Code strip 296 is attached by a bracket 297 to the front side wall of Z-axis support structure 141, and is vertically movable in slot 294 in response to relative motion between the Z-axis support structure 141 and vertical support plate 64.

Constructed and located as described above, optical encoder module 291 outputs a sequence of pulses which indicate the magnitude and direction of relative vertical movement between the Z-axis support structure 141 and vertical support plate 64. This sequence of pulses is inputted to a programmable electronic counter circuit which has a count output terminal that inputs a TRUE signal at a predetermined count to a first input terminal of an AND circuit. The AND circuit has a second input terminal which is coupled to a logic gate which produces a TRUE output signal when switch contacts 288 and 289 open. The output terminal of the AND circuit is connected to the input terminal of an electronic switch which responds to a TRUE signal by turning on an ultrasonic power generating circuit that powers ultrasonic transducer 74. With this implementation, when switch contacts 288 and 289 separate upon contact of ultrasonic bonding tool tip 34A with a bond site, additional downward movement must be effected by an operator until the Z-axis position pulse counter reaches a pre-determined number, before ultrasonic bonding energy is applied to the bond site. This additional downward movement causes tool tip 34, transducer mount assembly 250 and transducer support body 278 to move upwardly with respect to tool support plate 59, thus compressing spring 281 coupled between the transducer support body and the tool support plate. Then, when a wire contacting a bond site is deformed during application of ultrasonic energy to form a bond, potential energy stored in the compression spring ensures that sufficient compressive force to effect a good bond is still exerted downward on the wire as the contact point between the wire and bonding tool moves downwards relative to the bond site.

In preferred embodiments of micro-manipulator apparatus 40, means are provided for resisting inadvertent motion of tool tip 34A during the formation of ultrasonic bonds, so that the tool tip remains optimally positioned with respect to a wire and bond site during bond formation. Inadvertent tool tip motion which could adversely affect the quality of a bond can result from small involuntary hand jitters occurring in the human operator of the apparatus. Also the longer bonding pulse durations of about 300 milliseconds used in bonding insulated wires versus the 30 millisecond pulse duration typically used with uninsulated wires, increases the possibility of premature movement of the tool tip by the operator. This problem was discussed in applicant's co-pending application Ser. No. 08/801,042, filed Feb. 14, 1998, for an Ultrasonic Bonding Method And Apparatus With Locking Tool Tip, and the disclosure of that application is hereby incorporated by reference into the present disclosure. As stated in the aforementioned application, premature movement of the bonding tool tip in any direction can adversely affect ultrasonic bond formation, but premature motion in the up/down or Z-axis direction is most problematic. Longitudinal, Y-axis motions are nearly as problematic, and motions in a lateral or X-axis direction somewhat less problematic. To alleviate these problems motion inhibiting means are preferably included in apparatus 40, as will now be described.

Figure 9A:
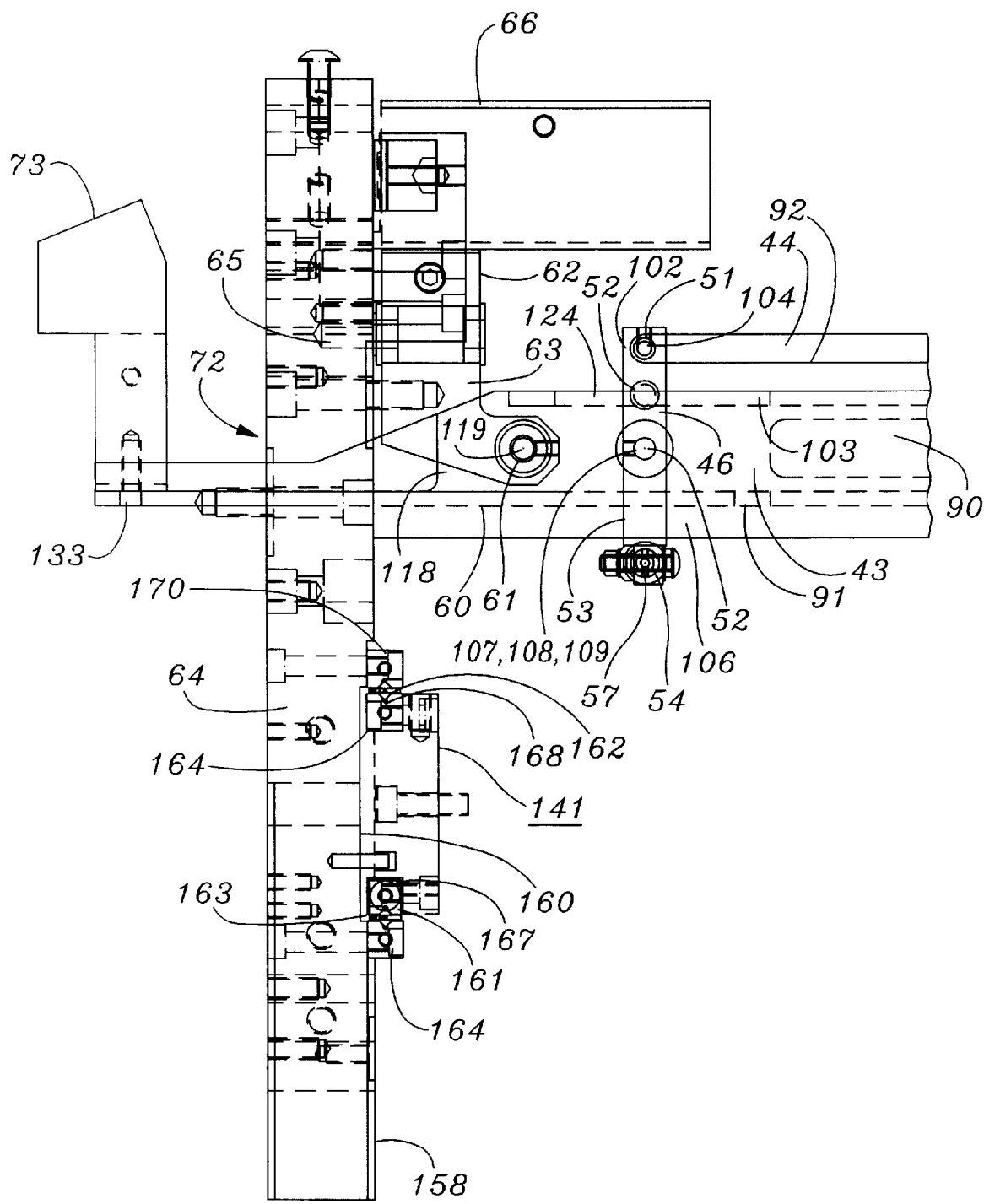
FIGS. 9A and 9B are fragmentary views similar to that of FIG. 9, but on an enlarged scale.
Figure 9B:
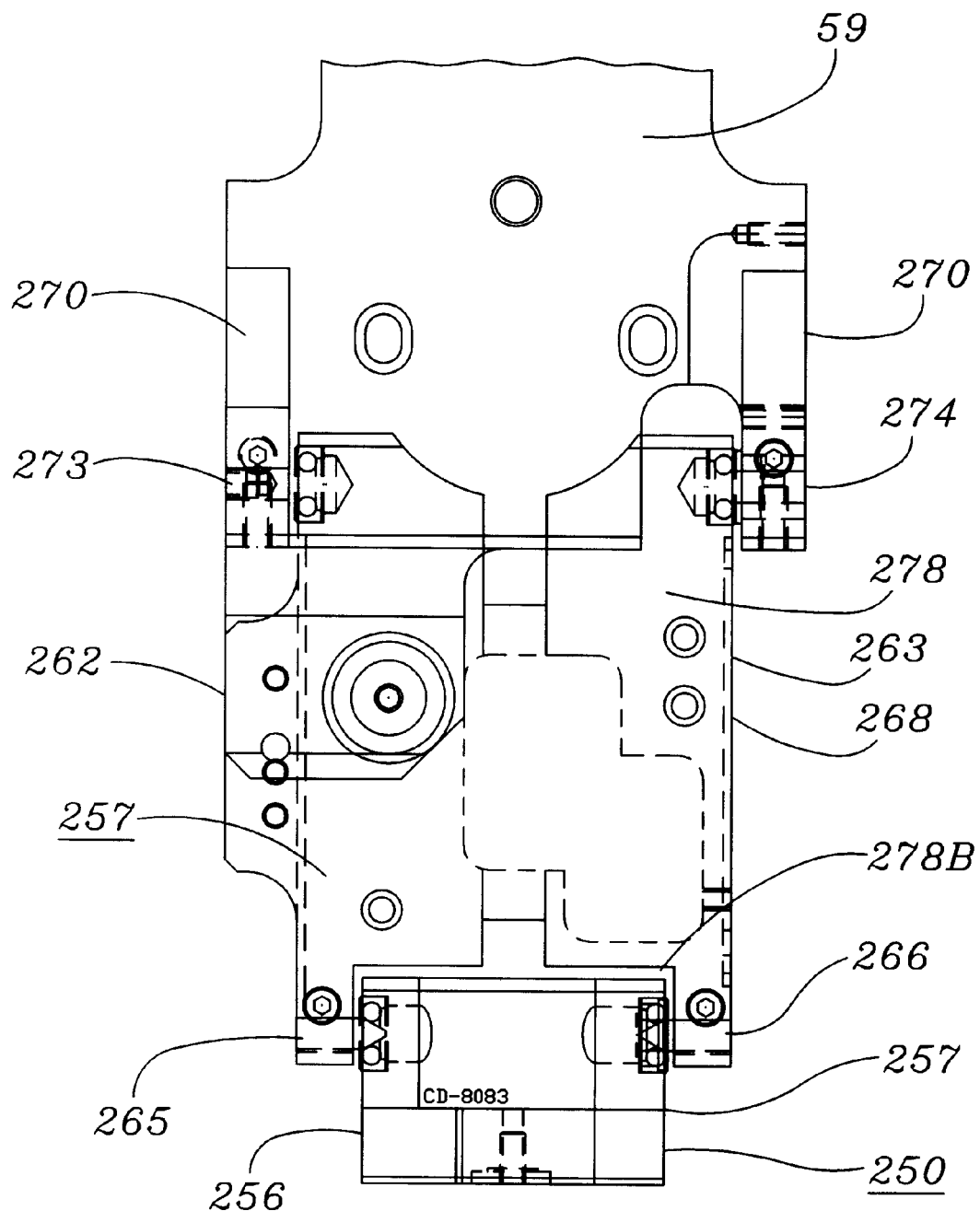
Figure 9C:
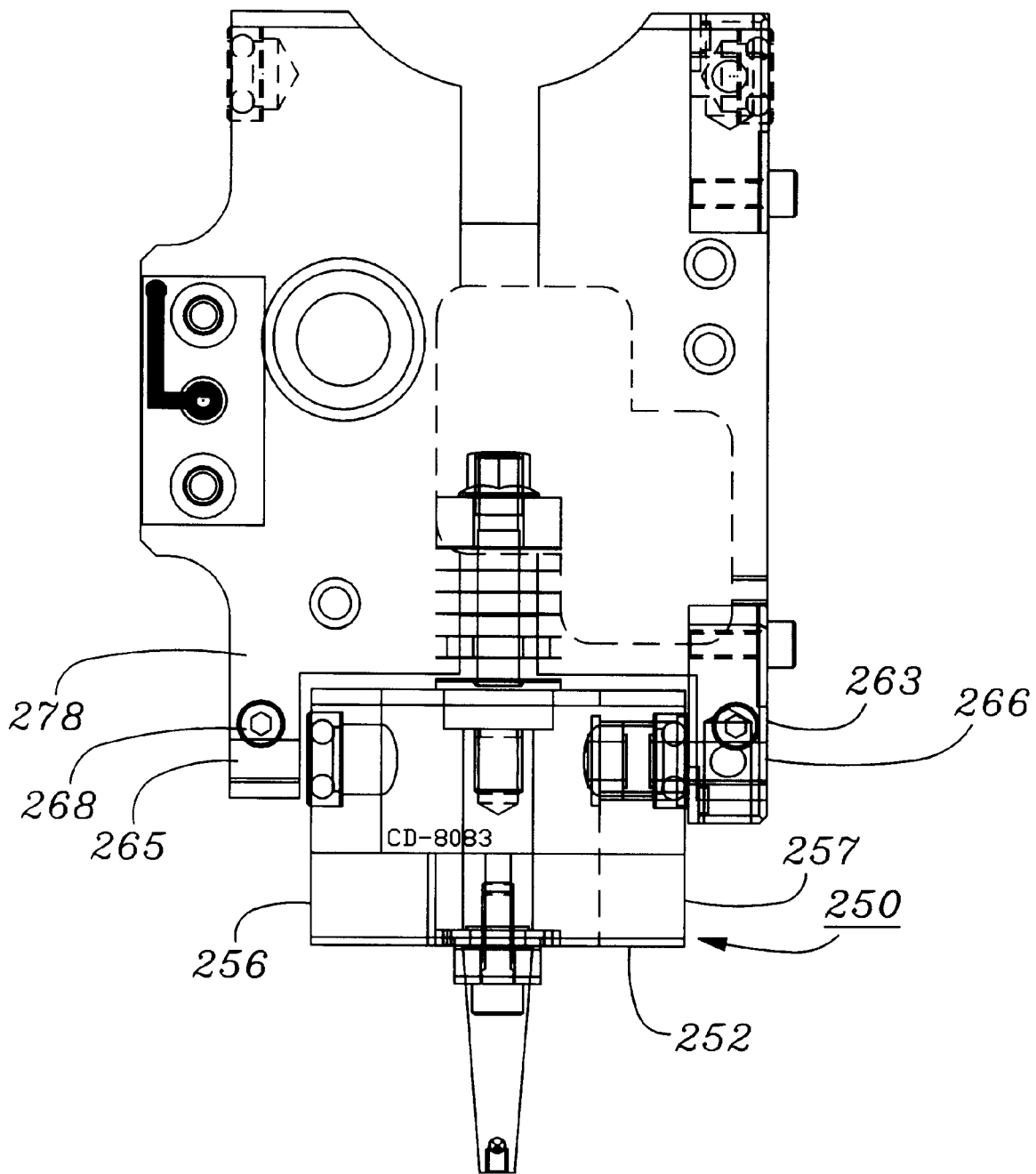
FIG. 9C is a fragmentary upper plan view of the apparatus of FIG. 2, on a further enlarged scale.

Referring now to FIG. 9A, apparatus 40 may include a Z-axis braking mechanism 299. The latter is effective in inhibiting or braking Z-axis or up/down motion of tip 34A of ultrasonic bonding tool 34 during bond formation and includes a flat leaf spring 300 attached to the left-hand or inner vertical side wall 301 of the Z-axis counterweight, adjacent to the right-hand or outer vertical wall surface 295 of vertical support plate 64. Leaf spring 300 has a longitudinally elongated rectangular plan view shape, including a relatively long flat rear section 302 fastened in flush contact with inner vertical wall surface 301 of Z-axis counterweight 66. Leaf spring 300 also has a short intermediate section 303 that angles obliquely forwardly from rear section 302 and outwardly from vertical wall surface 301 of Z-axis counterweight 66, towards outer wall 295 of vertical support plate 64. Leaf spring 300 has in addition a relatively long, flat front section 304 which joins the outer end portion of oblique intermediate portion 303. Front leaf spring section 304 is parallel to rear leaf spring section 302, and disposed laterally outwards from inner flat vertical surface 301 of Z-axis counterweight 66, towards outer wall surface 295 of vertical support plate 295. Both intermediate section 303 and front section 304 of leaf spring 300 protrude perpendicularly forward relative to front wall surface 305 of Z-axis counterweight 66.

Referring still to FIG. 9A, it may be seen that Z-axis brake 299 includes a pneumatic brake actuator 306 which includes a cylindrically-shaped piston 307 longitudinally slidably contained within a longitudinally disposed bore 308 in a cylinder 309. Actuator 306 includes an air inlet port fitting 310 having an air passageway 311 which communicates with an inlet bore 312 within cylinder 304. Inlet bore 312 communicates with piston bore 308, and is coaxial therewith.

As shown in FIG. 9A, a blind counterbored cavity 313 is formed in the head face 314 of piston 308. Cavity 313 functions as a plenum, allowing piston 207 to operate within piston bore 308 with minimal or zero head space.

Referring still to FIG. 9A, piston 307 may be seen to have an outer circular chamfered face 315 which abuts the outer forward surface of front leaf spring section 304. Thus, when pressurized air is supplied to actuator 306, piston 307 is pushed partially out from bore 308, forcing front leaf spring section 304 into frictional contact with outer right-hand wall surface 295 of vertical support plate 64. This action inhibits or brakes Z-axis counterweight 66 from pivoting in a vertical plane with respect to vertical support plate 66, thereby inhibiting or braking up/down Z-axis motion of tip 34A of ultrasonic transducer tool 74.

The novel construction of pneumatic brake actuator 306 allows effective operation of the actuator without the requirement for an exhaust valve. Thus, as shown in FIG. 9A, actuator cylinder housing 309, which is preferably made from a metal such as an aluminum alloy, has a bore which is about 0.0005 inch larger than the diameter of piston 307. As shown in FIG. 9A, actuator bore 308 penetrates outer wall surface 316 of actuator housing 309. Thus, when piston 307 is actuated by pressurized air supplied to actuator 306, air exits bore 308 at a rate controlled by the small annular ring-shaped clearance space between the piston and bore. Therefore, when a pulse of pressurized air applied to inlet 310 of actuator 306 is terminated, pressurized air leaks from the actuator, allowing leaf spring 300 to force piston 307 to its inner rest or quiescent position within actuator bore 308, without requiring an exhaust valve.

In the novel "leaky" construction of pneumatic brake actuator 306 described above, piston 307 has about 0.0005 inch radial free play within bore 308. Although this displacement is quire small, it could allow unacceptably large relative movement between Z-axis counterweight 66 and vertical support plate 64, when it is required to maintain ultrasonic transducer tool tip 34A precisely positioned relative to a workpiece. Therefore, instead of braking counterweight 66 relative to vertical support plate 64 by direct contact of outer piston face 315 with wall surface 295 of the vertical support plate, leaf spring 300 is positioned between the outer piston face and wall surface of the vertical support plate. Since leaf spring 300 is movable in a direction normal to its surface, but completely rigid in directions parallel to its surface, no tangential relative motion can recur between counterweight 66 and vertical support plate 64, in spite of the motion of piston 307 within its bore 308.

Figure 8A:
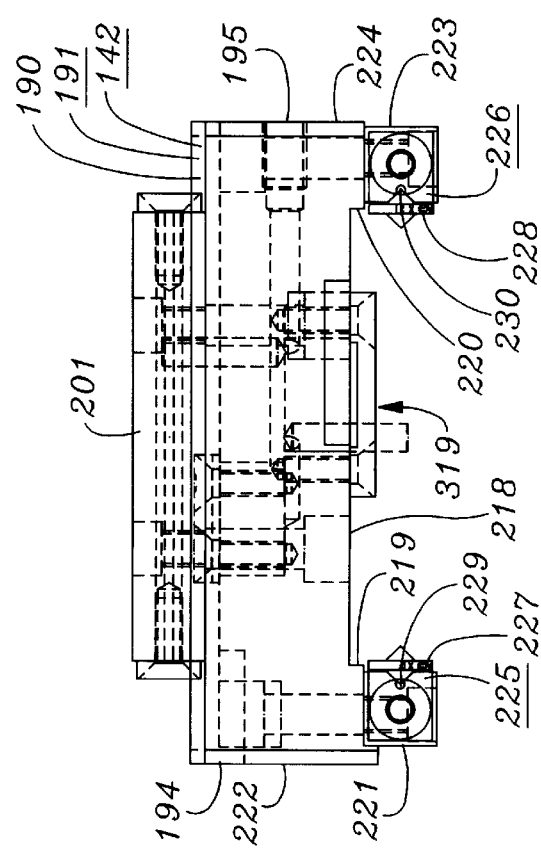
FIG. 8A is a fragmentary front elevation view of the bearing support structures of FIG. 7.

Micro-manipulator apparatus 40 optionally and preferably includes in addition to Z-axis brake mechanism 299 described above, Y-axis and X-axis brake mechanisms for inhibiting motion of tool tip 34A in those coordinate directions during delivery of ultrasonic bonding energy to a bonding site. Thus, as shown in FIGS. 7A and 8A, micro-manipulator apparatus 40 may include a Y-axis brake mechanism 319 mounted to lower surface 321 of X-axis slide plate 190. The structure and function of Y-axis brake mechanism 319 are substantially identical to those of Z-axis brake mechanism 299. Thus, Y-axis brake 319 includes elements 319–336 which are exactly analogous to elements 299–316 of the Z-axis brake mechanism, with the following differences. Braking action of Y-axis brake mechanism 319 is effected by frictional contact of the lower surface of a front, longitudinally and horizontally disposed section 324 of leaf spring 320 with the upper surface 317 of tool support plate 59. Also, air passageway 331 of air inlet port fitting 330 protruding through right side wall 193 of X-axis slide plate 190 has a laterally inwardly disposed extension bore 331A which communicates with inlet bore 332 of Y-axis actuator cylinder bore 328.

Referring still to FIG. 7A and 8A, it may be seen that micro-manipulator apparatus 40 may also include an X-axis brake mechanism 339, mounted to upper surface 337 of X-axis slide plate 190. The structure and function of X-axis brake mechanism 339 are substantially identical to those of Z-axis brake mechanism 299. Thus, X-axis brake 339 includes elements 339–356 which are exactly analogous to elements 299–316 of the Z-axis brake mechanism, with the following differences. Braking action of X-axis brake mechanism 339 is effected by frictional contact of the upper surface of a right-hand, upper laterally and horizontally disposed section 344 of leaf spring 340 with the lower surface 337 of X-axis bearing structure 142. Also, air passageway 331 of air inlet port fitting 330 which protrudes through right side wall 195 of X-axis slide plate 190 has a laterally inwardly disposed extension 331B that communicates with inlet bore 352 of X-axis actuator cylinder bore 348.

Each of the brake mechanisms described above is energized by pressurized air supplied through a solenoid valve which is opened concurrently for the duration of each bonding pulse, thus inhibiting inadvertent motion of bonding tool tip 34A in the respective coordinate directions of the brakes during formation of a bond.

FIGS. 14–18 illustrate modification of Y-Axis brake mechanism 319 and X-axis brake mechanism 339 described above. The modified brake mechanisms ensure that tool tip 36 of ultrasonic bonding tool 34 does not move even a minute amount in the Z-axis direction in response to vertical motion of the X-axis and Y-axis brake pistons.

Figure 14:
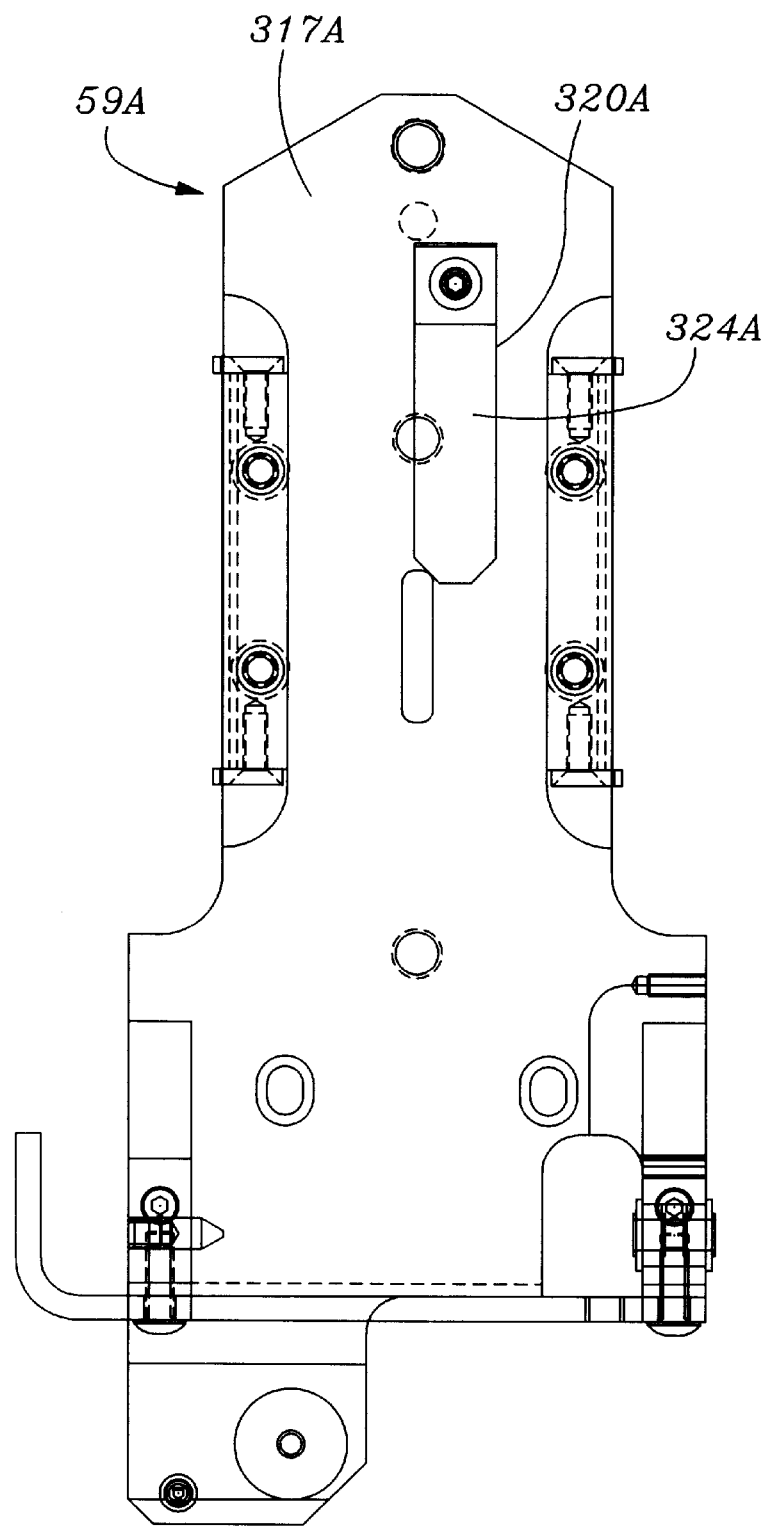
FIG. 14 is an upper plan view of a modified tool support plate according to the present invention.
Figure 15:
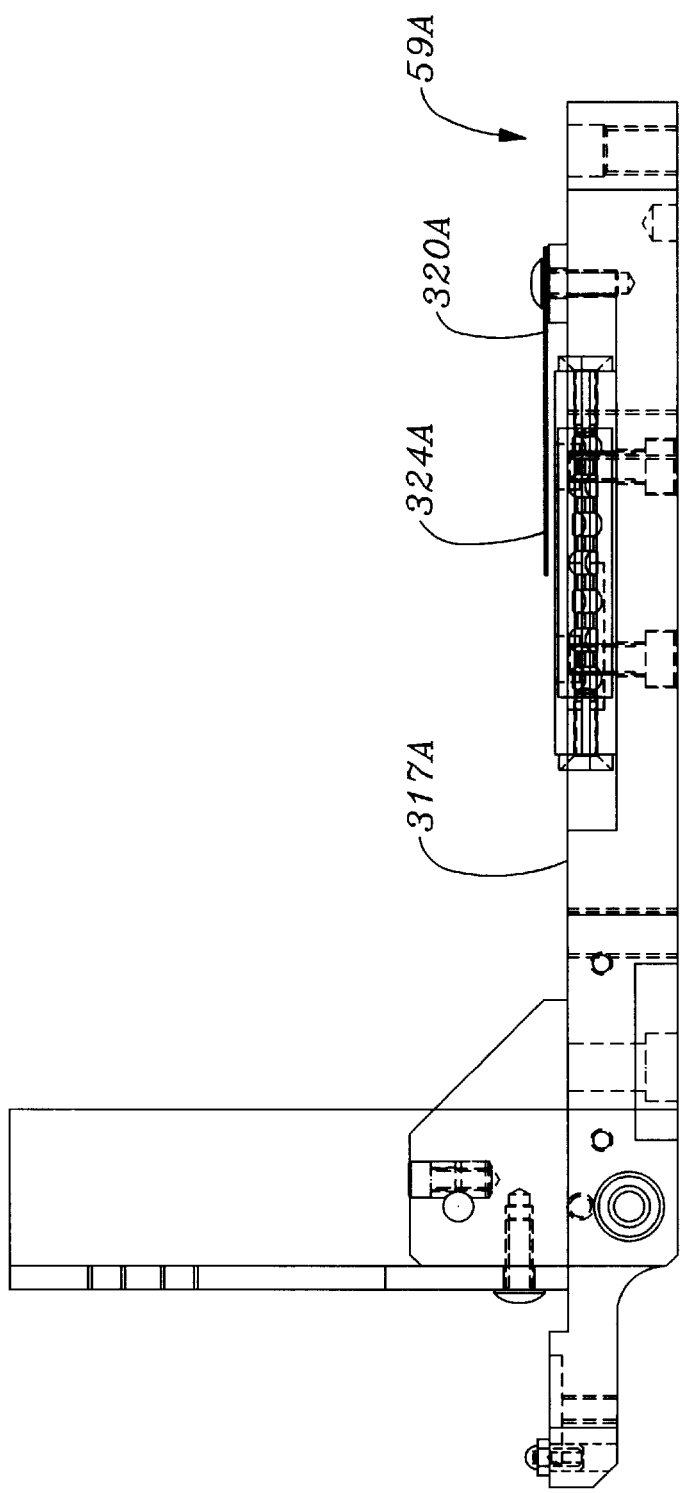
FIG. 15 is a right side elevation view of the article of FIG. 14.
Figure 16:
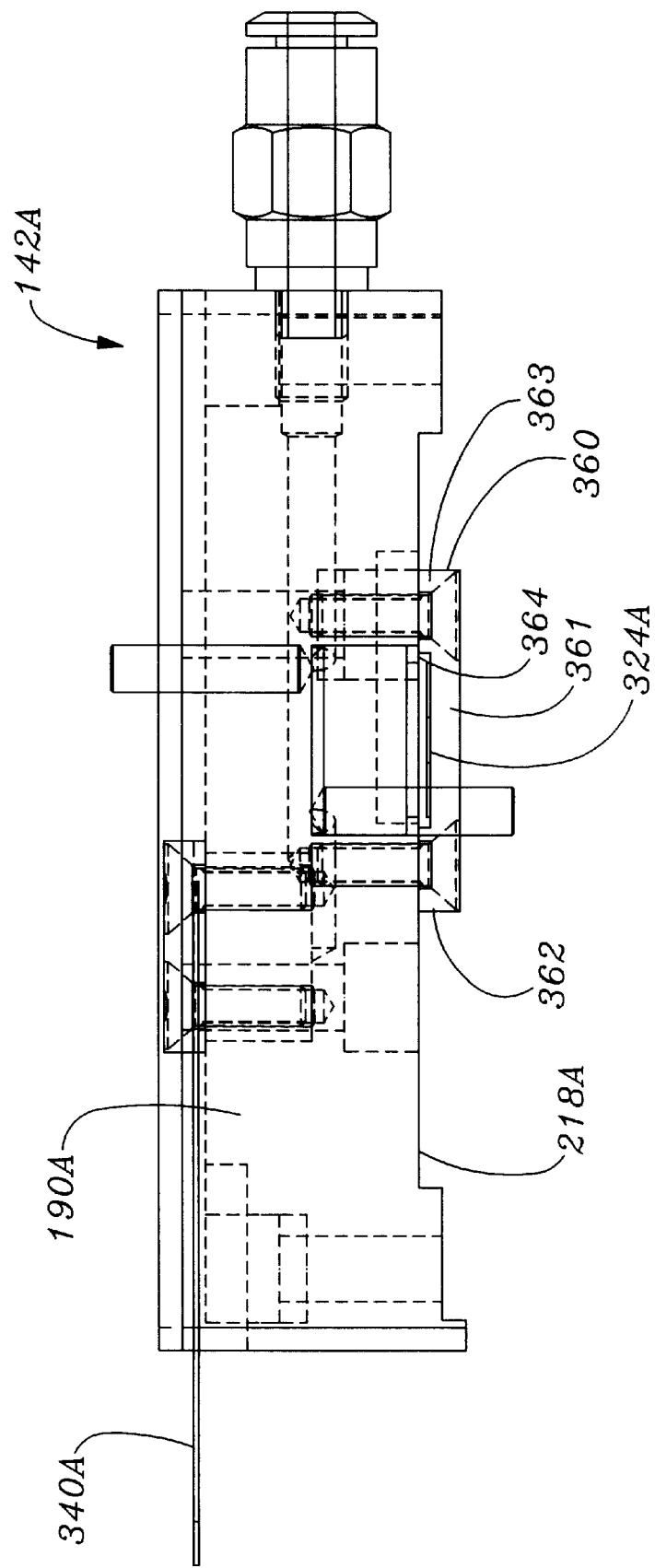
FIG. 16 is a front elevation view of a modified X-axis bearing support structure according to the present invention, on an enlarged scale.

Referring now to FIGS. 14 and 15, it may be seen that brake spring 320A of modified Y-axis brake mechanism 319A is attached to tool support plate 59A, rather than the X-axis bearing support structure 142, as in the embodiment depicted in FIGS. 7A and 8 and described above. As shown in FIGS. 14 and 15, leaf spring 320A has a longitudinal longitudinally elongated rectangular shape and is disposed parallel to and above upper surface 317A of tool support slide 59A. Leaf spring 320A is attached at the rear end thereof to upper surface 317A of tool support plate 59A, and has a front portion 324A. As shown in FIG. 16, modified Y-axis bearing structure 142A has in addition to the structural elements of bearing structure 142 described above, a Y-axis brake leaf clamp bracket 360 fastened to lower surface 218A of X-axis slide 190A of Y-axis bearing structure 142A. Brake leaf clamp bracket 360 has the shape of a laterally elongated U-channel member, including a laterally elongated base bar 361, and left and right uprights 362, 363 which protrude perpendicularly upwards from opposite lateral ends of the base bar, which are fastened at the upper ends thereof to lower surface 218A of the bearing structure 142A. Thus constructed, a longitudinally disposed, rectangular cross section channel 364 is formed between base bar 361 and lower surface 218A of the bearing structure.

As shown in FIG. 16, channel 364 insertably receives front portion 324A of brake spring 320A. Thus, when Y-axis brake piston 327A is extended downwardly in bore 328A of Y-axis brake cylinder 329A in response to pressurization of the cylinder, lower chamfered face 335A of the piston presses brake spring 320A against the upper surface of base bar 361 of Y-axis brake leaf clamp bracket 360. By squeezing brake leaf spring 320A, attached to tool support slide 59A, between piston 327A and base bar 361 of Y-axis brake spring clamp bracket 360, vertical displacement forces are not transferred to the tool support slide 59A in response to downward motion of the brake piston. Therefore, this modified construction precludes even miniscule downward motion of tool tip 36 with respect to a workpiece when modified Y-axis brake mechanism 319A is actuated.

Figure 17:
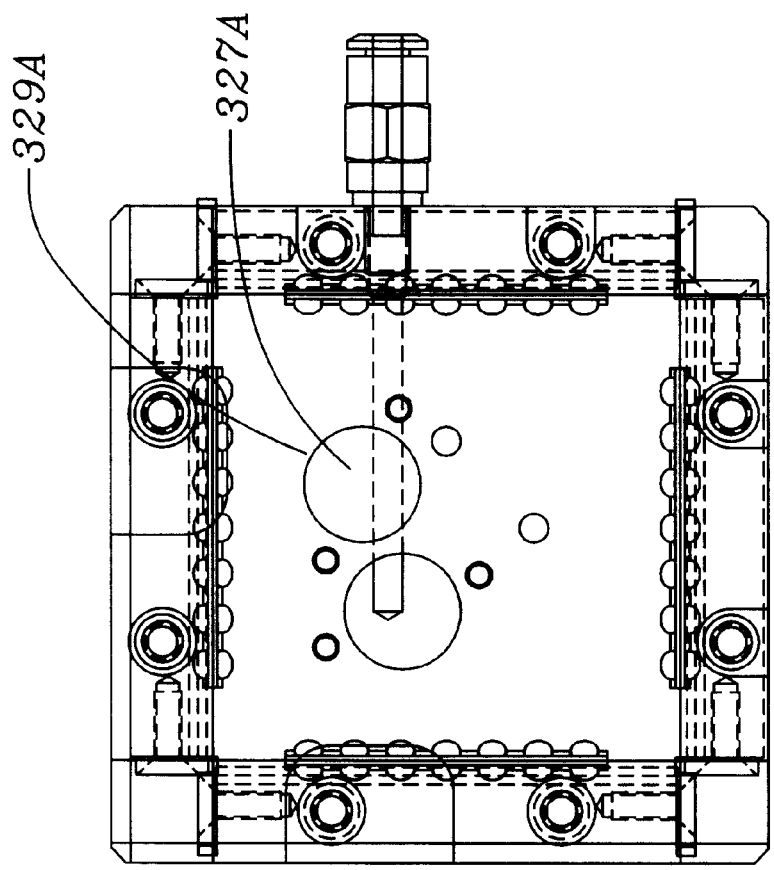
FIG. 17 is an upper plan view of the modified X-axis bearing support structure of FIG. 16.
Figure 18:
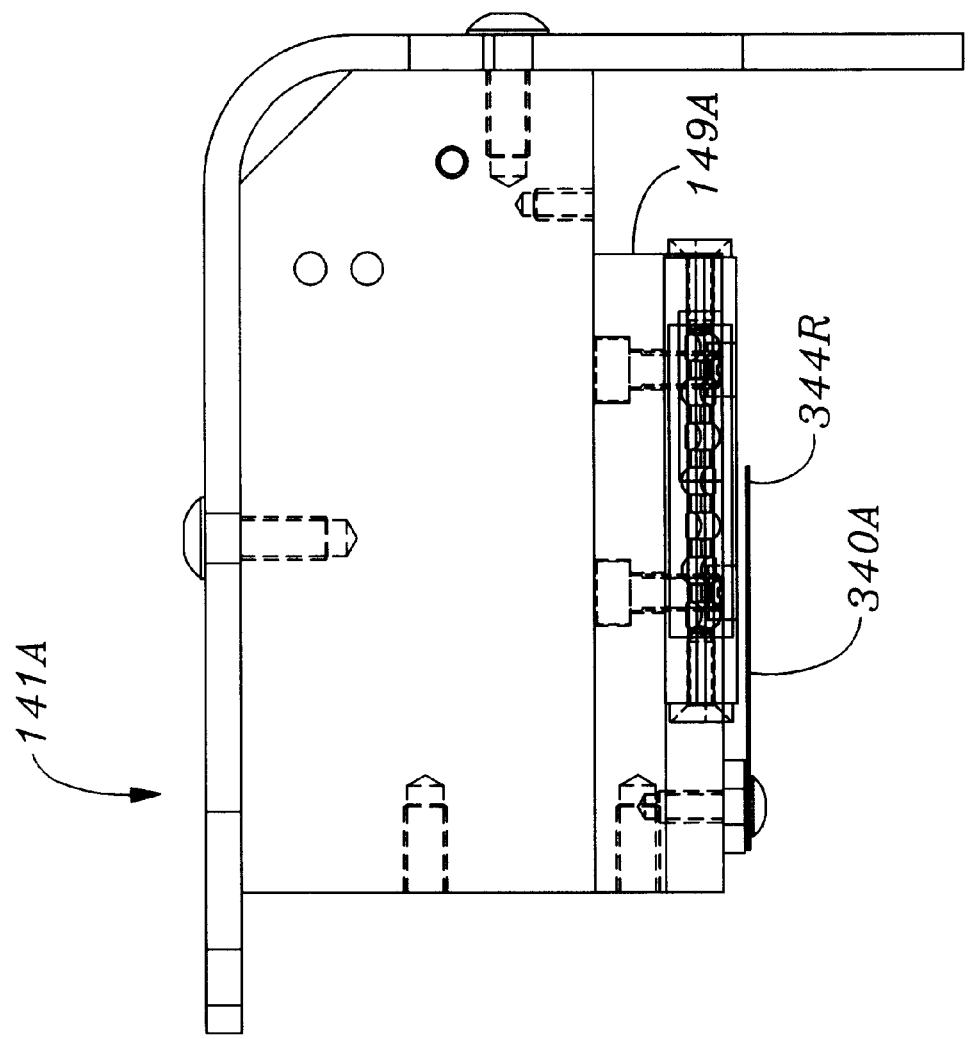
FIG. 18 is a front elevation view of a modified Z-axis bearing support structure according to the present invention.

FIGS. 16–18 illustrate a modified X-axis brake mechanism 339A which incorporates the structural and functional advantages of modified Y-axis brake mechanism 319A described above. Thus, as shown in FIGS. 16–18, X-axis brake leaf spring 340 of modified X-axis brake mechanism 339A is fastened to Z-axis support structure 141A, rather than X-axis bearing support structure, as in the embodiment depicted in FIGS. 7A and 8A and described above, leaf spring 340A has a laterally elongated rectangular plan-view shape, and is disposed parallel to and below lower surface 364A of laterally disposed base plate 144A of Z-axis support structure 141A. Leaf spring 340A is attached at the left or inner lateral end thereof to lower surface 364A of base plate 144A, and has a front portion 344A.

As shown in FIG. 16, modified Y-axis bearing structure 142A has in addition to the structural elements of bearing structure 142 described above, an X-axis brake leaf clamp bracket 380 fastened to upper surface 365A of X-axis slide 190A of X-axis bearing structure 142A. X-axis brake leaf clamp bracket 380 has the shape of a longitudinally elongated, inverted U-channel member, including a longitudinally elongated cap bar 381, and front and rear pedestals 382, 383 which depend perpendicularly downwards from opposite front and rear longitudinal ends of the cap bar, which are fastened at the lower ends thereof to upper surface 365A of the bearing structure 142A. Thus constructed, a laterally disposed, rectangular cross section channel 384 is formed between cap bar 381 and upper surface 365A of the bearing structure.

As shown in FIG. 16, channel 384 insertably receives outer, or right-hand lateral portion 344A of brake spring 340A. Thus, when X-axis brake piston 347A is extended upwardly in bore 348A of X-axis brake cylinder 349A in response to pressurization of the cylinder, upper chamfered face 355A of the piston presses brake spring 340A against the lower surface of cap bar 381 of X-axis brake leaf clamp bracket 380. By squeezing brake leaf spring 340A attached to base plate 144A of Z-axis support structure 141A, between piston 347A and cap bar 381 of X-axis brake spring clamp bracket 380, vertical displacement forces are not transferred to X-axis bearing support structure 142A in reaction to upward motion of the brake piston. Therefore, this modified construction of X-axis brake mechanism 339A precludes even miniscule downward translational motions of bearing support structure 142A, tool support slide 59A, and tool tip 36 with respect to a workpiece when the modified X-axis brake mechanism is activated.

What is claimed is:

1. A micro-manipulator apparatus for precisely positioning the tip of a wire bonding tool relative to a work piece, said apparatus comprising:

a. a support structure, b. a manipulator input mechanism having an input control element moveable in a first, input coordinate system, c. a follower mechanism including a tool holder for holding a wire bonding tool and moving the tip of said wire bonding tool in a second, output coordinate system, d. linear bearing means joining said follower mechanism to said support structure in a manner enabling linear motion of said follower mechanism relative to said support structure, and e. coupling means joining said manipulator input mechanism to said follower mechanism whereby motions of said input control element in a first input direction in said first coordinate system are operable through said coupling means to effect corresponding motion of said follower mechanism, tool handler and tool tip in a first output direction in said second coordinate system.

2. The apparatus of claim 1 wherein said motions of said tool tip are resolved into motions along coordinate axes of said second, output coordinate system that are in a predetermined relationship to motions of said input control element along corresponding coordinate axes of said first, input coordinate system.

3. The apparatus of claim 2 wherein said motions of said tool tip along coordinate axes of said second, output coordinate system are in predetermined ratios with respect to corresponding motions of said input control element along corresponding coordinate axes of said first, input coordinate system.

4. The apparatus of claim 1 wherein said linear bearing means joining said follower mechanism to said support structure is further defined as enabling linear motion of said follower mechanism in a second coordinate direction in said second, output coordinate system.

5. The apparatus of claim 4 wherein said second coordinate direction is further defined as being orthogonal to said first coordinate direction.

6. The apparatus of claim 5 wherein said linear bearing means is further defined as enabling linear motion of said follower mechanism in a third coordinate direction in said second coordinate system.

7. The apparatus of claim 6 wherein said third coordinate direction is further defined as being orthogonal to said first and second coordinate directions.

8. The apparatus of claim 7 wherein said linear bearing means is further defined as comprising in combination:
  a. a first, primary bearing slide structure movably fastened to said support structure by a first linear bearing assembly having a line of action along said first coordinate axis of said second coordinate system,
  b. a second, secondary bearing slide structure movably fastened to said first bearing slide structure by a second linear bearing assembly having a line of action orthogonal to that of said primary linear bearing assembly, and
  c. a third, tertiary, tool-support bearing slide structure movably fastened to said secondary bearing structure by a third linear bearing assembly having a line of action orthogonal to the lines of action of said primary and secondary linear bearing assemblies.

9. The apparatus of claim 8 wherein said primary, secondary and tertiary slide structures comprise a vertically cascaded series in which the lowest surface of said tertiary slide structure is at the lowest elevation of any element of said series.

10. The apparatus of claim 9 wherein said manipulator input mechanism is located to the rear of and at a higher elevation than said follower mechanism, whereby said tip of said bonding tool, when attached to and protruding downwardly from said lower surface of said tertiary slide structure may be located at the lowest elevation of any element of said apparatus, thereby providing a work space of potentially unlimited lateral extent beneath said apparatus.

11. The apparatus of claim 10 wherein said manipulator input mechanism is further defined as including a four-bar parallelogram linkage.

12. The apparatus of claim 11 wherein said coupling means is further defined as a ball joint joining said follower mechanism to said manipulator input mechanism.

13. The apparatus of claim 12 wherein said four-bar parallelogram linkage is further defined as being pivotally mounted at an inner end thereof to a hanger member by a parallelogram support bearing having a pivot axis disposed perpendicularly to the plane of action of said parallelogram linkage.

14. The apparatus of claim 13 wherein said hanger member is further defined as being pivotably mounted to a vertical support structure plate by a hanger support pivot bearing having a pivot axis perpendicular to said pivot axis of said parallelogram support bearing.

15. A micro-manipulator apparatus for precisely positioning the tip of a wire bonding tool relative to a work piece, said apparatus comprising:
  a. a support structure including a support plate,
  b. a manipulator input mechanism having an input control element moveable in a first, input coordinate system, said manipulator input mechanism being pivotably fastened to said support plate,
  c. a follower mechanism including a lower tool support plate for supporting a tool,
  d. cascaded linear bearing means joining said follower mechanism to said support plate, said cascaded bearing means comprising (i) a first, z-axis bearing slide structure rollably mounted to said support plate by a first, z-axis linear bearing assembly having a vertical line of action, (ii) a second, x-axis bearing slide structure rollably mounted to said z-axis bearing slide structure by a second, x-axis linear bearing assembly having a lateral line of action orthogonal to said line of action of said z-axis bearing assembly, and (iii) a third, y-axis linear bearing assembly which rollably supports said lower tool support plate along a longitudinal line of action orthogonal to said lines of action of said x-axis bearing assembly and said z-axis bearing assembly, and
  e. coupling means joining said manipulator input mechanism to said follower mechanism whereby motions of said input control element in input directions in said first coordinate system are operable through said coupling means to effect corresponding motion of said follower mechanism, tool handler and tool tip in output directions in said second coordinate system.

16. The apparatus of claim 15 wherein said manipulator input mechanism as further defined as including a four-bar parallelogram linkage having relatively long, generally laterally disposed front and rear bars, a laterally outwardly located, relatively short outer linkage bar having an extension arm which protrudes forward from said front long bar, said extension arm having at a front end thereof a hand grip ball comprising said input element of said manipulator mechanism, and a laterally inwardly located short inner linkage bar having a coupler extension which protrudes forward from said front longer linkage bar, said coupler extension being coupled to a rear portion of said tool support plate by a ball joint.

17. The apparatus of claim 16 further including at least a first braking means for inhibiting motion of said tool tip relative to said work piece in at least a first direction in said second coordinate system during operation of said tool on said work piece.

18. The apparatus of claim 17 wherein said first coordinate direction in which said first braking means is effective in inhibiting motion of said tool tip is further defined as being substantially parallel to a line of action defined by said tool tip moving normally to said work piece.

19. The apparatus of claim 18 further including a second braking means for inhibiting motion of said tool tip in a second direction orthogonal to said first direction.

20. The apparatus of claim 19 further including a third braking means for inhibiting motion of said tool tip in a third direction orthogonal to said first and second directions.

21. The apparatus of claim 18 wherein said braking means is further defined as acting on said manipulator input mechanism.

22. The apparatus of claim 17 wherein said braking mechanism is further defined as being a linear actuator which applies a normal force resulting in braking friction between relatively movable elements of said apparatus.

23. The apparatus of claim 22 wherein said linear actuator is further defined as being a pneumatic cylinder including a piston longitudinally slidable within a bore, said piston having radial free-play clearance sufficiently large to permit air to leak at a controlled rate from said bore.

24. The apparatus of claim 23 further including brake free-play limiting means for limiting tangential relative motion between said relatively movable elements of said apparatus.

25. The apparatus of claim 24 wherein said brake free-play limiting means is further defined as being a leaf spring located between the outer face of said piston and a surface of a first one of said relatively movable elements, said leaf spring being attached to one of said moveable elements and being elastically deformable in a direction parallel to longitudinal motion of said piston, but rigid in directions radial thereto.

26. The apparatus of claim 17 wherein said four-bar parallelogram linkage is further defined as being pivotably mounted near an inner lateral and thereof to a hanger member by a parallelogram support bearing having a pivot axis disposed perpendicularly to the plane of action of said parallelogram linkage.

27. The apparatus of claim 26 wherein said hanger member is further defined as being pivotably mounted to said support plate of said support structure.

28. The apparatus of claim 15 wherein said tool is further defined as being an ultrasonic wire bonding tool.

29. The apparatus of claim 28 wherein said tool support plate is further defined as having a transducer mount assembly for holding said tool, said transducer mount assembly being pivotably mounted to said tool holder by a transducer mount assembly pivot means, whereby the tip of said tool may pivot upwards with respect to said tool support plate.

30. The apparatus of claim 29 wherein said transducer mount assembly pivot means is further defined as including force adjusting means, whereby downward force exerted on a work piece in response to contact by said tool tip may be limited to a predetermined value.

31. The apparatus of claim 30 further including sensor means for sensing when said tool tip has contacted said work piece with a predetermined force, said sensor means being operably interconnected to a source of bonding energy conducted to said tool tip, whereby said predetermined force initiates bonding action on said work piece.

32. The apparatus of claim 31 wherein said sensor means is further defined as comprising in combination spring means resiliently urging said transducer mount assembly pivotably downwards with respect to said tool support plate, and first position sensing means for providing a first, tilt signal upon said tool tip contacting said work piece with a first force sufficiently large to pivot said transducer mount assembly upwardly a first predetermined distance.

33. The apparatus of claim 32 wherein said sensor means is further defined as including a second position sensor providing a second, z-axis displacement signal proportional to vertical motion of said tool support plate relative to said mechanism support plate, said second sensor having an output signal logically ANDED with said first, tilt sensor output signal to initiate a bonding energy pulse only upon tilting of said tool tip sufficient to activate said first sensor and further downward displacement of said tool support plate sufficient to compress said spring means, said compressed spring means being effective in forcing a wire into contact with a bond site with a predetermined force sufficient to ensure formation of an effective bond during downward deformation of the wire in response to application of ultrasonic energy by said tool tip.

34. In a wire bonding machine including an apparatus for moving a bonding tool tip into contact with a wire to cause the wire to contact a bonding site on a work piece during formation of a bond, the improvement comprising first sensor means for initiating application of a pulse of bonding energy to said tool tip upon resilient pivotable displacement of the tool tip away from said work piece in response to moving said tool tip forward into contact with said wire and said bond site.

35. The improvement in a wire bonding machine of claim 34 further including second sensor means for determining displacement of said bonding tool, a predetermined distance towards said bond site, said second sensor having an output signal logically ANDED with an output signal from said first sensor thereby to initiate a bonding energy pulse only upon actuation of said first sensor in response to a predetermined contact force of said tool tip with said work piece, and further forward displacement of said tool tip towards said work piece.

36. In a micro-manipulator apparatus for precisely positioning the tip of a wire bonding tool relative to a workpiece, said apparatus including a manipulator input mechanism having an input control element moveable in a first coordinate system, a follower mechanism including a tool holder for holding a wire bonding tool and moving the tip of said wire bonding tool relative to said workpiece in a second coordinate system, and coupling means joining said manipulator input mechanism to said follower mechanism whereby motions of said input control element in said first coordinate system are operable through said coupling means to effect motions of said tool tip in said second coordinate system, the improvement comprising;

at least a first braking means for inhibiting motion of said tool tip relative to said workpiece in at least a first direction in said second coordinate system during operation of said tool on said workpiece, said braking means operable to inhibit relative motion between first and second relatively movable elements of said manipulator mechanism and comprising in combination brake arm means attached to said first relatively movable element, and brake arm-gripping means fastened to said second relatively movable element which insertably receives said brake arm means, said brake arm-gripping means including an actuator effective in exerting a gripping force on said brake arm when actuated, and permitting free relative movement of said brake arm when not actuated.

37. The apparatus of claim 36 wherein said first coordinate direction in which said first braking means is effective in inhibiting motion of said tool tip relative to said workpiece is further defined as being substantially perpendicular to a line of action defined by said tool tip moving normally to said workpiece.

38. The apparatus of claim 37 further including a second braking means for inhibiting motion of said tool tip in a second direction orthogonal to said first direction and said line of action of said tool tip.

39. The apparatus of claim 38 further including a third braking means for inhibiting motion of said tool tip in a third direction parallel to said line of action of said tool tip.

40. The improvement in a micro-manipulator apparatus of claim 36 wherein said actuator is further defined as being a linear actuator.

41. A micro-manipulator apparatus for precisely positioning the tip of a wire bonding tool relative to a work piece, said apparatus comprising:
   a. a support structure,
   b. a manipulator input mechanism having an input control element moveable in a first, input coordinate system,
   c. a follower mechanism including a tool holder for holding a wire bonding tool and moving the tip of said wire bonding tool in a second, output coordinate system,
   d. linear bearing means joining said follower mechanism to said support structure in a manner enabling linear motion of said follower mechanism in first and second directions in said output coordinate system relative to said support structure, and
   e. coupling means joining said manipulator input mechanism to said follower mechanism whereby motions of said input control element in first and second input directions in said first coordinate system are operable through said coupling means to effect corresponding motions of said tool tip in first and second output directions, respectively in said second coordinate system.

* * * * *